(12) United States Patent
Furusawa et al.

(10) Patent No.: US 8,227,090 B2
(45) Date of Patent: *Jul. 24, 2012

(54) BONDING MATERIAL, ELECTRONIC COMPONENT, BONDING STRUCTURE AND ELECTRONIC DEVICE

(75) Inventors: Akio Furusawa, Osaka (JP); Kenichiro Suetsugu, Hyogo (JP); Shigeki Sakaguchi, Kyoto (JP); Kimiaki Nakaya, Osaka (JP)

(73) Assignee: Panasonic Corporation, Osaka (JP)

( * ) Notice: Subject to any disclaimer, the term of this patent is extended or adjusted under 35 U.S.C. 154(b) by 400 days.

This patent is subject to a terminal disclaimer.

(21) Appl. No.: 12/302,157

(22) PCT Filed: May 18, 2007

(86) PCT No.: PCT/JP2007/060267
§ 371 (c)(1),
(2), (4) Date: Nov. 24, 2008

(87) PCT Pub. No.: WO2007/136009
PCT Pub. Date: Nov. 29, 2007

(65) Prior Publication Data
US 2009/0242249 A1    Oct. 1, 2009

(30) Foreign Application Priority Data

May 24, 2006  (JP) .................. 2006-144031
Dec. 27, 2006 (JP) .................. 2006-351244
Jan. 15, 2007 (JP) .................. 2007-005608

(51) Int. Cl.
*B32B 15/04* (2006.01)

(52) U.S. Cl. ...................... 428/642; 428/457

(58) Field of Classification Search ................. None
See application file for complete search history.

(56) References Cited

U.S. PATENT DOCUMENTS

| 5,415,944 | A  | * | 5/1995  | Kazem-Goudarzi et al. . 428/567 |
| 6,156,132 | A  |   | 12/2000 | Yamashita et al. |
| 6,652,968 | B1 | * | 11/2003 | Miller et al. ................. 428/407 |
| 2002/0012608 | A1 |   | 1/2002 | Takaoka et al. |
| 2004/0170524 | A1 |   | 9/2004 | Lambrachi et al. |
| 2006/0113683 | A1 | * | 6/2006 | Dean et al. .................... 257/783 |
| 2006/0193744 | A1 | * | 8/2006 | Yang ............................. 420/561 |
| 2010/0035072 | A1 | * | 2/2010 | Watanabe et al. ............. 428/457 |

FOREIGN PATENT DOCUMENTS

| EP | 1 914 035 A1 | 4/2008 |
| JP | 2001-205477 | 7/2001 |
| JP | 2004-025232 | 1/2004 |
| JP | 2004-114093 | 4/2004 |
| JP | 2006-167790 | 6/2006 |
| WO | WO 02/101105 A1 | 12/2002 |
| WO | WO 2007/018288 A1 | 2/2007 |

OTHER PUBLICATIONS

European Search Report issued in European Patent Application No. 07743702.8-1215, mailed Feb. 2, 2010.

* cited by examiner

*Primary Examiner* — Callie Shosho
*Assistant Examiner* — Krista Lynch
(74) *Attorney, Agent, or Firm* — McDermott Will & Emery LLP

(57) ABSTRACT

A bonding material that has a melting temperature of 270° C. or higher and that does not contain lead is inexpensively provided. An electronic element and an electrode of an electronic component are bonded using a bonding material containing an alloy that contains Bi as the main component and that contains 0.2 to 0.8 wt % Cu and 0.02 to 0.2 wt % Ge.

16 Claims, 22 Drawing Sheets

Fig.1

| | Ag | Al | Au | Bi | Co | Cr | Cu | Ga | Ge | In | Mg | Mn | Mo | Ni | Pd | Pt | Si | Sn | Zn |
|---|---|---|---|---|---|---|---|---|---|---|---|---|---|---|---|---|---|---|---|
| Ag | | | | | | | | | | | | | | | | | | | |
| Al | 556 | | | | | | | | | | | | | | | | | | |
| Au | — | 525 | | | | | | | | | | | | | | | | | |
| Bi | 262 | 657 | 241 | | | | | | | | | | | | | | | | |
| Co | *1 | 657 | 996 | *1 | | | | | | | | | | | | | | | |
| Cr | *1 | — | — | *1 | 1395 | | | | | | | | | | | | | | |
| Cu | 779 | 548 | — | 270 | — | 1076 | | | | | | | | | | | | | |
| Ga | 25 | 26.4 | 339 | 222 | *1 | *1 | — | | | | | | | | | | | | |
| Ge | 651 | 424 | 356 | 271 | 810 | 390 | 640 | 29.3 | | | | | | | | | | | |
| In | 141 | 637 | 450 | 72 | *1 | *1 | 150 | 15.7 | — | | | | | | | | | | |
| Mg | 471 | 437 | 576 | 260 | *1 | *1 | 485 | 423 | 635 | — | | | | | | | | | |
| Mn | — | 650 | 960 | 262 | — | — | — | *1 | *1 | *1 | *1 | | | | | | | | |
| Mo | *1 | 1500 | *1 | *1 | 1340 | — | *1 | *1 | *1 | *1 | *1 | *1 | | | | | | | |
| Ni | 1435 | 640 | — | — | — | 1345 | — | 1200 | 775 | 920 | 506 | 1147 | 1309 | | | | | | |
| Pd | — | 615 | — | *1 | — | 1315 | — | *1 | *1 | — | *1 | — | 1700 | — | | | | | |
| Pt | — | 1400 | — | *1 | — | 1500 | — | *1 | *1 | *1 | *1 | — | 2080 | — | — | | | | |
| Si | 940 | 577 | 363 | *1 | 1260 | 1320 | 802 | — | — | — | 640 | *1 | 1410 | 996 | 816 | 830 | | | |
| Sn | 221 | 228 | 217 | 138 | 229 | *1 | 227 | 20.5 | 232 | 120 | 200 | — | *1 | 1130 | 1210 | 228 | *1 | | |
| Zn | — | 382 | 630 | 255 | — | *1 | — | 25 | 398 | 143 | 364 | — | *1 | 419 | *1 | — | 419 | 198 | |

*1 Not available (a)

(b)

(a)                          (b)

US 8,227,090 B2

BONDING MATERIAL, ELECTRONIC COMPONENT, BONDING STRUCTURE AND ELECTRONIC DEVICE

RELATED APPLICATIONS

This application is the US National Phase under 35 U.S.C. §371 of International Application No. PCT/JP2007/060267 filed on May 18, 2007, which claims the benefit of Japanese Application Nos. JP 2006-144031 filed on May 24, 2006, JP 2006-351244 filed on Dec. 27, 2006, and JP 2007-005608 filed on Jan. 15, 2007, the disclosures of which Applications are incorporated by reference herein.

TECHNICAL FIELD

The present invention relates to a bonding material, an electronic component, a bonded structure and an electronic device.

BACKGROUND ART

In the case of an electronic component provided with an electronic element, an electrode and an electronic element bonding material for bonding them, a solder material is generally used as the electronic element bonding material. The electronic component is produced by bonding the electronic element and the electrode using the solder material. The electronic component is mounted on a substrate such as a motherboard further using another bonding material that is different from the electronic element bonding material. For example, a solder material having a melting point of 200 to 230° C. is generally used as the material for bonding the electronic component, such as a chip inductor, and the motherboard.

When the electronic component is mounted on the motherboard, the electronic component is heated in conjunction with the motherboard chiefly by a reflow device of the hot-air method to melt the solder material having a melting point of 200 to 230° C. In this instance, the temperature of the electronic component reaches 230 to 260° C., and if the electronic element bonding material inside the electronic component is molten, defects may be found in the final product. The electronic element bonding material is therefore required to have a melting temperature that is higher than the maximum temperature the electronic component reaches in the reflow device. Thus, for example, a solder material that is a Pb—Sn alloy containing lead as the main component and about 15 wt % Sn and having a melting temperature of 288° C. has been in use as the electronic element bonding material. However, when a Pb—Sn alloy is used as the solder material, once an electronic device that has as a control means a substrate on which the electronic component is mounted is disposed of and left in a natural environment, there is a concern that lead is released into the soil from the solder material.

With the recent awareness of environmental protection, solder that does not contain lead (lead-free solder) has been in development. For example, a solder material composed of a Pb—Sn alloy having a melting temperature of 200 to 250° C. is being replaced by a solder material composed of an Sn—Ag alloy, Sn—Cu alloy or Sn—Ag—Cu alloy. In particular, a solder material composed of an Sn-3% Ag-0.5% Cu alloy having a melting temperature of 220 to 230° C. is generally used. However, when electronic components are mounted on substrates, the electronic components may be heated to a temperature higher than the melting temperatures of those solder materials. In that case, in the electronic components in which those solder materials are used as electronic element bonding materials, the solder materials may be molten, resulting in a defect in bonding of electronic elements and electrodes.

Moreover, a solder material having a relatively high melting point has been proposed (for example, see Patent Document 1). In Table 1 on page 7 of Patent Document 1 in particular, a lead-free solder material composed of an alloy containing Bi as the main component and a small amount of Ag is proposed. When a small amount of Ag is added to Bi, a eutectic alloy of Bi and Ag (for example, eutectic alloy containing 97.5 wt % Bi and 2.5 wt % Ag (Bi-2.5% Ag)) is generated. The melting temperature of this eutectic alloy is 262° C. Since the upper limit of the heating temperature of the reflow device that performs mounting of an electronic component on a motherboard is about 260° C., an electronic component in which an electronic element and an electrode are bonded using this solder material is considered not to cause any trouble in mounting the electronic component on a motherboard. However, since the temperature of hot air for use in heating is 270 to 300° C., an electronic component having a small heat capacity, such as a chip inductor, needs to have a heatproof temperature about 10° C. higher than the upper limit of the temperature of heating by the reflow device (at least about 270° C.). Therefore, the solder material disclosed in the aforementioned patent publication also cannot be used to bond an electronic element and an electrode in an electronic component that has a small heat capacity.

Furthermore, it is important in the development of lead-free solder materials to reduce the Ag content. It is of requirement that household electric appliances and electronic devices are produced inexpensively. The price of Ag per gram is as high as about 40 yen, and thus the lower the amount thereof used, the more desirable it is. Therefore, also in Sn—Ag alloys, Sn—Ag—Cu alloys and Bi—Ag alloys and the like, efforts have been made to reduce the Ag content to about 0.3 wt % or less or to replace Ag with another element in order to keep the material costs low.

For example, the addition of Zn, Sn, In or a like element to a bismuth alloy that contains Bi as the main component has been investigated. However, the melting temperature of a eutectic alloy composed of 96 wt % Bi and 4 wt % Zn (Bi-4% Zn) is 255° C., the melting temperature of a eutectic alloy composed of 58 wt % Bi and 42 wt % Sn (Bi-42% Sn) is 138° C., the melting temperature of a eutectic alloy composed of 35 wt % Bi and 65 wt % In (Bi-65% In) is 72° C., and a bismuth alloy that has a melting temperature of 270° C. or higher is not yet obtained. Moreover, these eutectic alloys needs attention since these eutectic alloys are generated locally even when the amounts of the additional elements are small.

Patent Document 1: Japanese Laid-Open Patent Publication No. 2001-353590

DISCLOSURE OF THE INVENTION

Problem to be Solved by the Invention

An object of the present invention is to provide a bonding material that has a melting temperature of, for example, 270° C. or higher, does not contain lead, can be preferably used to bond an electronic element and an electrode in an electronic component, and is inexpensive.

Another object of the present invention is to provide an electronic component in which an electronic element and an electrode are bonded by the aforementioned bonding material, a bonded structure that includes the electronic component, and an electronic device that has as a control means a circuit board including the bonded structure.

Means for Solving the Problem

The present invention relates to a bonding material containing a bismuth alloy having a Cu content of 0.2 to 0.8 wt % and a Ge content of 0.02 to 0.2 wt % with the remainder being Bi.

In the bonding material of the present invention, the bismuth alloy further contains Ni, and the Ni content is preferably 0.02 to 0.08 wt %.

In the bonding material of the present invention, it is preferable that the bismuth alloy further contains at least one filler selected from the group consisting of spherical fillers, needle-shaped fillers and plate-shaped fillers, and the filler content is 0.05 to 5.0 wt %.

In the bonding material of the present invention, it is preferable that the filler contains at least one material selected from the group consisting of resin materials, inorganic materials and metallic materials.

In the bonding material of the present invention, it is preferable that plating is performed on the surface of the filler, and the plating contains at least one metal selected from the group consisting of Ag, Pd, Au and Sn.

Moreover, the present invention is directed to an electronic component provided with an electronic element, an electrode connected to the electronic element, and an electronic element bonding material that bonds the electronic element and the electrode, and the electronic element bonding material is any one of the aforementioned bonding materials containing a bismuth alloy.

In the electronic component of the present invention, it is preferable that the amount of Sn incorporated into the electronic element bonding material from at least one member selected from the group consisting of an Sn-containing plating formed on a surface of the electronic element, an Sn-containing plating formed on a surface of the electrode, the electronic element, which may contain Sn, and the electrode, which may contain Sn, or the amount of Sn contained as an unavoidable impurity in the electronic element bonding material is 40 wt % or less of the total amount of the electronic element bonding material and Sn.

Moreover, the present invention relates to a bonded structure provided with (a) an electronic component, (b) a substrate on which the electronic component is mounted and (c) an electronic component bonding material that bonds the electronic component and the substrate, and the electronic component (a) is any one of the electronic components of the present invention, and the electronic component bonding material (c) is a bonding material having a melting temperature lower than that of the bismuth alloy contained in the electronic element bonding material included the electronic component (a).

Furthermore, the present invention is directed to an electronic device that includes as a control means a circuit board furnished with the aforementioned bonded structure.

Effect of the Invention

According to the present invention, a bonding material that has a melting temperature of, for example, 270° C. or higher, does not contain lead and is inexpensive can be provided. By the use of the bonding material of the present invention to bond an electronic element and an electrode in an electronic component that has a small heat capacity, defects that may occur when the electronic component is mounted on a motherboard can be significantly inhibited.

Moreover, according to the present invention, an electronic device that has as a control means a circuit board including a bonded structure obtained by mounting on a motherboard an electronic component in which an electronic element and an electrode are bonded using the bonding material of the present invention is provided. The electronic device of the present invention has high reliability since the electronic device is controlled by a circuit board that includes a bonded structure in which defects that may occur when an electronic component is mounted on a motherboard are very few. Furthermore, the electronic device of the present invention even when disposed of in a natural environment does not release lead into the natural environment since the circuit board is free of lead. In this specification, electronic devices include not only electronic devices but also various electric appliances and electrical devices.

BRIEF DESCRIPTION OF THE DRAWINGS

FIG. 1 is a table showing the eutectic points of binary alloys.

BEST MODE FOR CARRYING OUT THE INVENTION

[Bonding Material]

Figure 2:
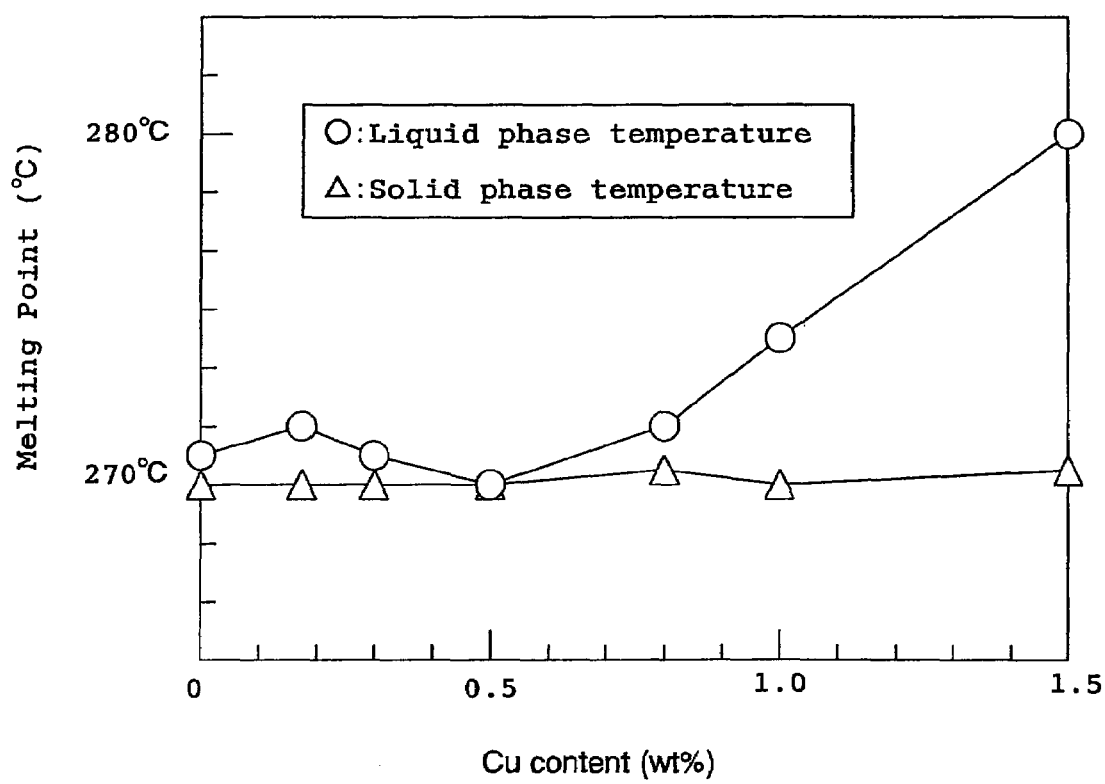
FIG. 2 is a graph showing the relationship between the Cu content in a binary alloy of Bi and Cu and the melting point of the Bi—Cu alloy.

The bonding material (1) of the present invention is characterized in containing a bismuth alloy (1) that contains Cu and Ge with the remainder being Bi and an unavoidable impurity, and that does not contain lead. In the bismuth alloy (1), the Cu content is 0.2 to 0.8 wt %, and preferably 0.4 to 0.6 wt %, of the total amount of the bismuth alloy (1). The Ge content is 0.02 to 0.2 wt %, and preferably 0.02 to 0.05 wt %, of the total amount of the bismuth alloy (1).

The bonding material (2) of the present invention is characterized in containing a bismuth alloy (2) that contains Cu, Ge and Ni with the remainder being Bi and an unavoidable impurity, and that does not contain lead. In this bismuth alloy (2), the Cu content is 0.2 to 0.8 wt %, and preferably to 0.6 wt %, of the total amount of the bismuth alloy (2). The Ge content is 0.02 to 0.2 wt %, and preferably 0.02 to 0.05 wt %, of the total amount of the bismuth alloy (2). The Ni content is 0.02 to 0.08 wt %, and preferably 0.02 to 0.05 wt %, of the total amount of the bismuth alloy (2). The bonding material (2), by containing Ni in a specific amount, has a higher impact resistance while maintaining the preferable properties of the bonding material (1).

The bonding materials (1) and (2) have very high melting temperatures of 270° C. or higher. Therefore, the bonding materials are suitable for use as electronic element bonding materials for bonding electronic elements and electrodes, for example, in electronic components having a small heat capacity, such as chip inductors. By the use of the bonding materials (1) and (2) having high melting temperatures inside electronic components, defects that may occur when the electronic component are mounted on a motherboard using a reflow device are significantly inhibited. Moreover, the bonding materials (1) and (2) can be inexpensively produced because of not containing any expensive element (for example, Ag). Furthermore, a lead-free electronic device can be provided because the bonding materials (1) and (2) do not contain lead.

The reason for specifying the Cu and Ge contents in the bismuth alloys (1) and (2) to be within the aforementioned ranges is as follows.

When a bonding material that has a melting temperature of 270° C. or higher is to be obtained, it is effective to use a binary alloy (alloy composed of two elements) having a eutectic point of 270° C. or higher as a base (base material). When selecting among numerous elements a combination of elements so as to attain a eutectic point of 270° C. or higher, attention should be paid to the presence and absence of toxicity and price of the elements. Elements such as Pb, Hg, Sb and Se are excluded in view of toxicity.

FIG. 1 is a table showing the eutectic points of binary alloys. The numerical value presented in a field where an element of a vertical axis and an element of a horizontal axis meet is the eutectic point of an alloy composed of those two elements. It can be understood from FIG. 1 that, for example, the eutectic point of an Sn—Ag alloy is 221° C., and an Ni—Cu alloy does not have a eutectic point. Moreover, it can be understood that a combination of Bi and Cu or a combination of Bi and Ge gives an alloy having a eutectic point of 270 to 300° C.

Here, the eutectic alloy of Bi and Cu contains 99.5 wt % Bi and 0.5 wt % Cu (Bi-0.5% Cu). The eutectic alloy of Bi and Ge contains 99 wt % Bi and 1 wt % Ge (Bi-1% Ge). The price of Ge is, however, about 420 times as high as that of Cu. Therefore, from the viewpoint of providing an inexpensive material, the combination of Bi and Cu is advantageous.

FIG. 2 is a graph showing the relationship between the Cu content (wt %) in a binary alloy of Bi and Cu (Bi—Cu alloy) and the melting point (liquid phase temperature or solid phase temperature) of the Bi—Cu alloy. In FIG. 2, when the Cu content is 0.8 wt % or less, the liquid phase temperature is 270 to 272° C., and the temperature difference from the solid phase temperature is small. On the other hand, when the Cu content exceeds 1.0 wt %, the liquid phase temperature is 275° C. or higher, and the temperature difference from the solid phase temperature is expanded to 5° C. or greater. At a temperature between the liquid phase temperature and the solid phase temperature, the solid phase and the liquid phase coexist. Therefore, when the temperature difference between the liquid phase temperature and the solid phase temperature is 5° C. or greater, the workability as a bonding material is poor, resulting in reduced productivity in a manufacturing premise. For the reasons described above, it is desirable that the Cu content is 0.8 wt % or less. On the other hand, when the Cu content is less than 0.2 wt %, the wettability between the bonding material when molten and an electrode or the like is poor. Therefore, it is desirable that the Cu content is 0.2 wt % or greater. Moreover, the Cu content of 0.4 to 0.6 wt % enables a bonding material that has better-balanced properties to be obtained.

A Bi—Cu alloy containing 0.2 to 0.8 wt % Cu is a bonding material advantageous in respect of not being molten at a temperature below 270° C. However, it was found in a test according to the meniscus method that the wettability is poor. The Bi—Cu alloy contains a large amount, i.e., 99.5 wt %, of Bi. Therefore, a large amount of oxide is generated in the alloy, and this is considered to affect the wettability. It is considered possible to inhibit the oxidation of Bi by adding to a Bi—Cu alloy a small amount of an element that is more preferentially oxidized than Bi. Elements that are more preferentially oxidized than Bi may be Ge, Al, Li, P, etc.

Figure 3:
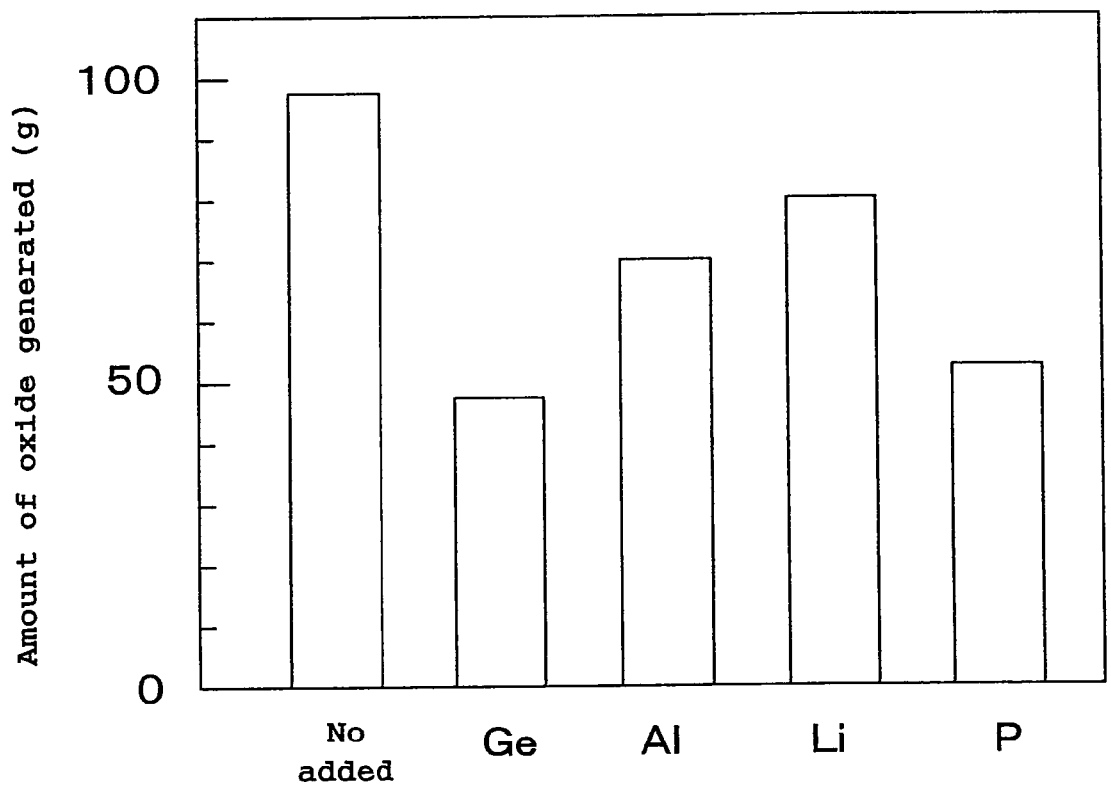
FIG. 3 is a graph showing the amount of oxide generated when Ge, Al, Li or P is added to a eutectic alloy composed of Bi and Cu.

FIG. 3 is a graph showing the amounts of the oxide generated in the samples when 0.05 wt % Ge, Al, Li or P is added to a eutectic alloy composed of 99.5 wt % Bi and 0.5 wt % Cu (Bi-0.5% Cu) and stirred at 300° C. for 4 hours, provided that the total weight of an entire sample is 8 kg. It can be understood that compared with the sample to which none of those elements is added, the generation of the oxide was suppressed in the sample to which Ge is added. This may be attributed to that Ge is preferentially oxidized on the surface of the Bi-0.5% Cu and forms an oxide film. For the reason described above, it can be understood that in order to suppress the oxidation of a Bi—Cu alloy, the addition of Ge is suitable.

Figure 4:
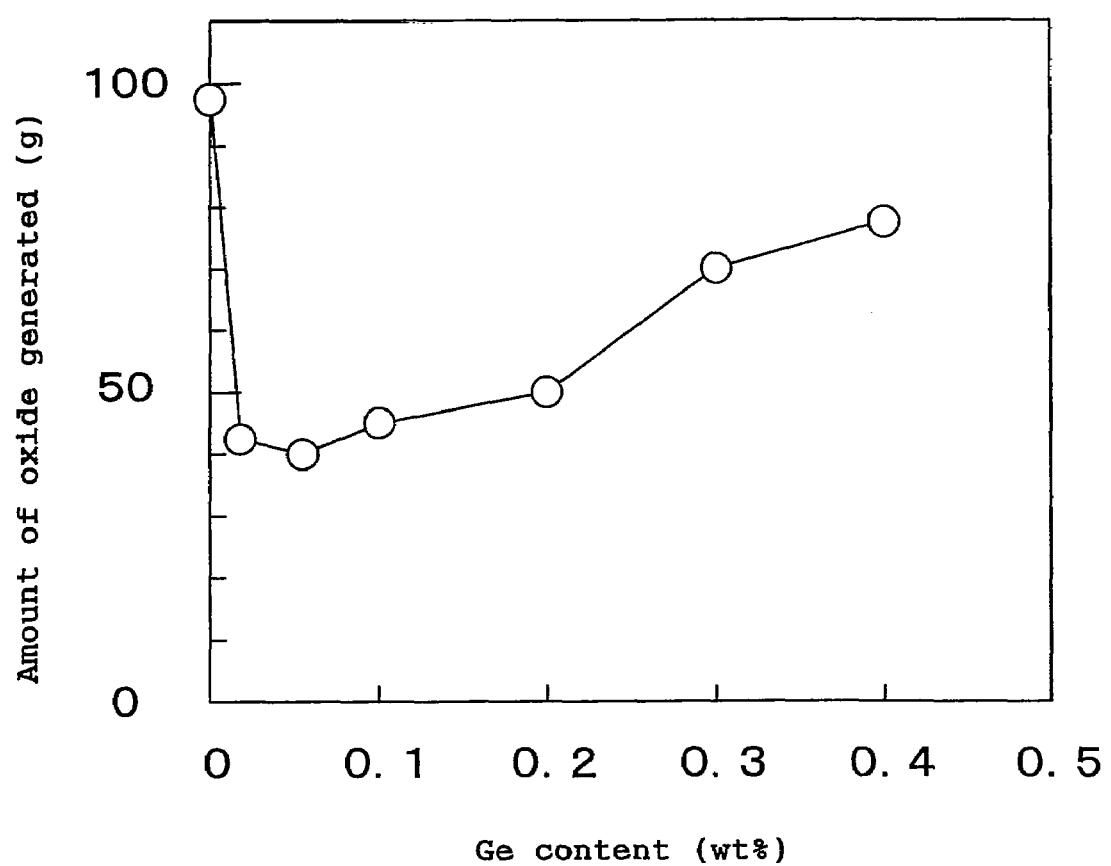
FIG. 4 is a graph showing the relationship between the Ge content and the amount of oxide generated in a ternary alloy of Bi, Cu and Ge.

FIG. 4 is a graph showing the relationship between the Ge content (wt %) and the amount of oxide generated in a ternary alloy of Bi, Cu and Ge (Bi—Cu—Ge alloy) containing 0.5 wt % Cu, provided that the total weight of the entire sample is 8 kg. It can be understood from FIG. 4 that when 0.02 wt % or greater of Ge is added, the generation of oxide is inhibited, but when the Ge content is 0.3 wt % or greater, the amount of oxide generated is increased. FIG. 4 shows that the Ge content is preferably 0.02 to 0.2 wt %, and more preferably 0.02 to 0.05 wt %.

The reason for specifying the Ni content in the bismuth alloy (2) to be within the aforementioned range is as follows. Impact resistance can be evaluated by a test in which 60 g of a spindle is collided from the height of 180 mm against a lateral side of a chip capacitor having a size of 1.6 mm×0.8 mm.

When the above-described impact resistance test was carried out using a chip capacitor that had a portion bonded to a ternaly alloy containing 99.46 wt % Bi, 0.5 wt % Cu and 0.04 wt % Ge (Bi-0.5% Cu-0.04% Ge), the chip capacitor was broken at the bonded portion. An observation of the cross section of the broken bonded portion showed that breakage occurred at the interface between the α phase having a large Bi content and the β phase having a large Cu content.

Here, the uniformity of the α phase and the β phase can be evaluated based on a crystal outer circumference value. The crystal outer circumference value is defined as the total length of the outer circumference of the α phase present within an area of 10 μm×10 μm. When the crystal outer circumference value is large, the mixing of the α phase and the β phase is sufficient, and when the crystal outer circumference value is small, the mixing with the α phase and the β phase is not sufficient. The crystal outer circumference value in the cross section of the bonded portion broken in the above-described test was measured, and the crystal outer circumference value was 87 μm.

Figure 5:
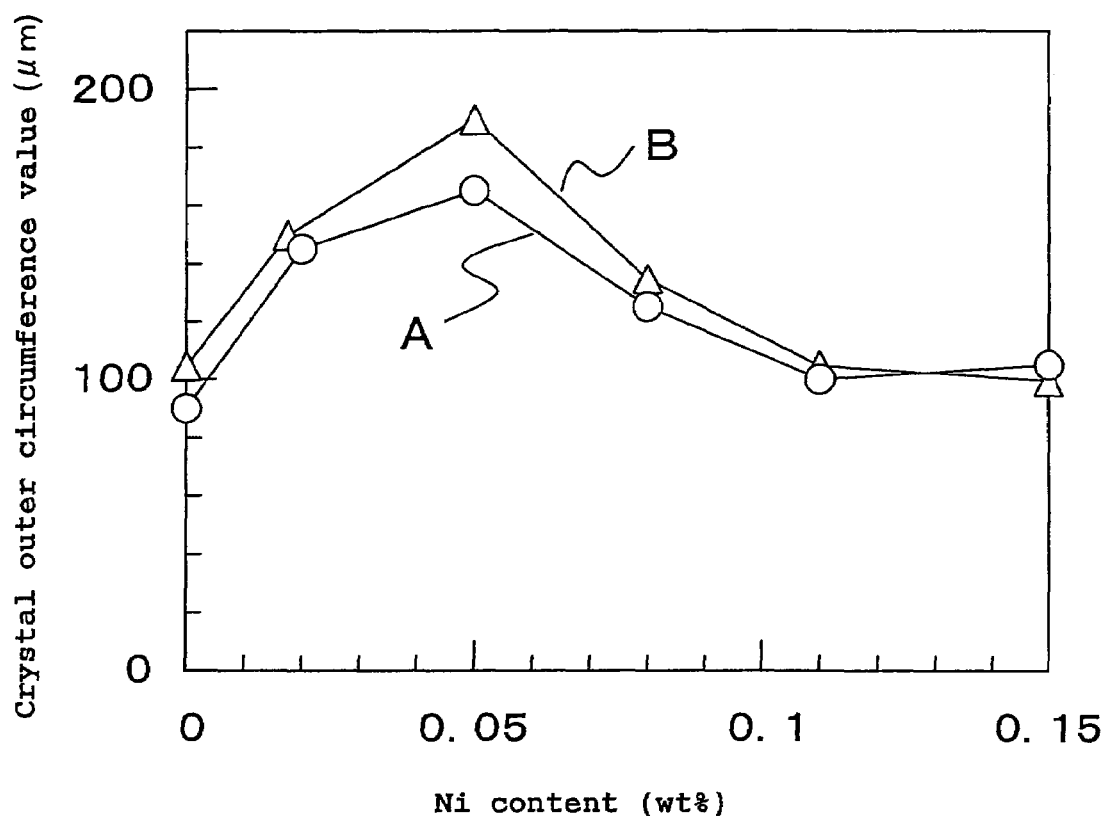
FIG. 5 is a graph showing the relationship between the Ni content and the crystal outer circumference value of a quaternary alloy of Bi, Cu, Ge and Ni.

FIG. 5 shows the relationship between the Ni content (wt %) and the crystal outer circumference value in a quaternary alloy of Bi, Cu, Ge and Ni (Bi—Cu—Ge—Ni alloy) containing 0.5 wt % Cu and 0.04 wt % Ge (graph A). FIG. 5 also shows the relationship between the Ni content (wt %) and the crystal outer circumference value in a Bi—Cu—Ge—Ni alloy containing 0.5 wt % Cu and 0.2 wt % Ge (graph B). It can be understood from FIG. 5 that when the Ni content is 0.02 to 0.08 wt %, the crystal outer circumference value is large, and the α phase and the β phase are uniformly mixed. On the other hand, it can be understood that when the Ni content is 0.11 wt % or greater, the crystal outer circumference value is small, and the α phase and the β phase are not uniformly mixed. It can be understood from FIG. 5 that the Ni content is preferably 0.02 to 0.08 wt %, and more preferably 0.02 to 0.05 wt %.

The bismuth alloys (1) and (2) may further contain at least one filler selected from the group consisting of spherical fillers, needle-shaped fillers and plate-shaped fillers. In this case, the filler content is 0.05 to 5.0 wt % of the amount of the bismuth alloy (1) or (2). Alloys containing a large amount of Bi such as the bismuth alloys (1) and (2) for use in the present invention have lower mechanical strength than Pb—Sn alloys. However, by introducing a specific filler into such a bismuth alloy, the mechanical strength thereof can be enhanced without impairing the preferable properties possessed by the bismuth alloy. When a commonly used filler other than those mentioned above is added, the melting point of a bismuth alloy is severely altered, resulting in deteriorated workability.

That is, the bonding material (1) of the present invention that contains the bismuth alloy (1) containing specific amounts of Cu, Ge and a filler of a specific shape as well as Bi as the remainder is a bonding material that is not molten up to 270° C. in soldering and has excellent impact resistance and even more enhanced mechanical strength. For example, when this bonding material is used for bonding inside an electronic component such as a chip inductor, the bonded portions inside the electronic component are not molten by the heat in mounting the electronic component on a motherboard, and defects are not created even by an external impact. In addition, the bonding material (2) of the present invention that contains the bismuth alloy (2) containing specific amounts of Cu, Ge, Ni and a filler of a specific shape as well as Bi as the remainder is a bonding material having more enhanced impact resistance while maintaining the preferable properties of the bonding material (1) containing a filler of a specific shape.

Spherical fillers, needle-shaped fillers and plate-shaped fillers are composed of resin materials, inorganic materials, metallic materials, etc. Resin materials are not particularly limited, and for example, polyether ether ketone (PEEK), polyether sulphone (PES), polyamide-imide (PAI), polytetrafluoroethylene (PTFE), polybutylene terephthalate (PBT), polyethylene terephthalate (PET), polyphenylene ether (PPE), polymer alloy materials containing two or more of these resin materials, and like thermoplastic resins are preferably usable. These thermoplastic resins are known as engineering plastics of high heat resistance. Inorganic materials also are not particularly limited, and for example, glass, diatomaceous earth, montmorillonite, silica, alumina, silicon and the like are preferably usable. Metallic materials also are not particularly limited, and for example, nickel, aluminium, titanium and the like are preferably usable.

With respect to the shape of spherical fillers, particles are not particularly limited insofar as at least a part of the surface has a plane having a radius of curvature, i.e., a curved surface, and those that are perfectly spherical, that have the average circularity close to that of a perfect sphere, that are spheroidal, and the like are preferably usable. Here, the average circularity was measured using a flow-type particle image analyzer (trade name: FPIA-2000, manufactured by Sysmex Corporation). The average circularity is defined by (boundary length of a circle that has the same projected area as a particle image)/(boundary length of a projected particle image) in a particle image detected by the measurement device, and takes a value of not greater than 1. The average circularity closer to 1 means that the particle shape is closer to being perfectly spherical. Needle-shaped fillers include, in addition to fillers that have a prismatic shape, fillers that are called whiskers. Plate-shaped fillers include, in addition to fillers that have a plate shape, flake-shaped fillers.

The average particle diameter of spherical, needle-shaped and plate-shaped fillers is not particularly limited, and is preferably 10 to 60 μm, and more preferably 20 to 40 μm. An average particle diameter less than 10 μm results in increased viscosity when the bismuth alloys are processed into a paste form, and printing onto a circuit board may thus be difficult. An average particle diameter exceeding 60 μm may result in an insufficient mechanical strength enhancement effect. Spherical fillers, needle-shaped fillers and plate-shaped fillers can be used singly, and can be used in a combination of two or more. Here, the average particle diameter was measured using a Microtrac particle size distribution measurement device (trade name: MT3000, manufactured by Nikkiso Co., Ltd.). The average particle diameter refers to a particle size that reaches a cumulative particle size of 50% in a particle size distribution detected by the aforementioned Microtrac size distribution measurement device.

Furthermore, plating may be performed on the surface of spherical, needle-shaped and plate-shaped fillers. It is preferable that a plating layer formed on the surface of a filler contains at least one metal selected from Ag, Pd, Au and Sn. The thickness of the plating layer is not particularly limited, and is preferably about 1 to 3 μm. When Ag plating is performed on a filler, since the filler content in the bismuth alloy is not large and the amount of Ag required in plating is small, Ag plating does not lead to an increase of the amount of Ag used. The use of a plated filler can further enhance, in particular, mechanical strength while maintaining the preferable properties of the bonding materials (1) and (2) of the present invention.

Figure 6:
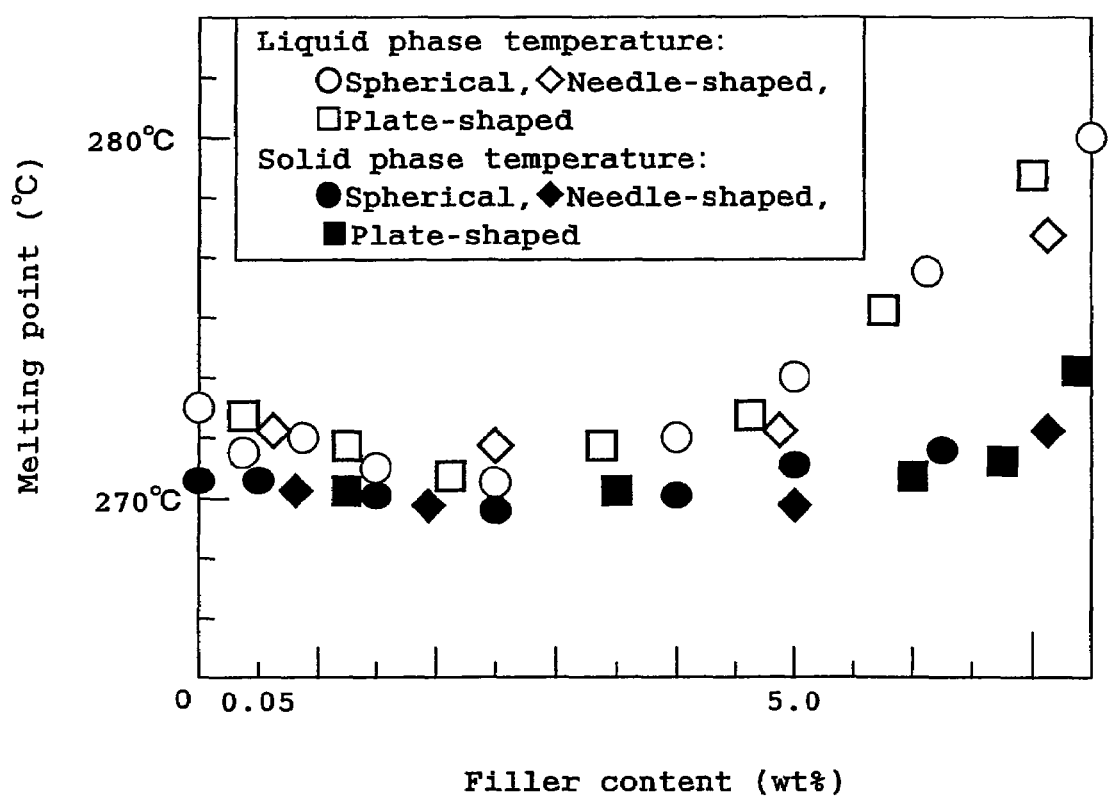
FIG. 6 is a graph showing the relationship between the filler content and the melting point of a ternary alloy of Bi, Cu and Ge.

FIG. 6 to FIG. 10 show the relationship between the filler content and the melting point of the bismuth alloy (1) when a filler is contained in the bismuth alloy (1). FIG. 6 shows the relationship between the filler content (wt %) in a ternary alloy of Bi, Cu and Ge (Bi—Cu—Ge alloy) and the melting point (liquid phase temperature or solid phase temperature) of the Bi—Cu—Ge alloy. Spherical, needle-shaped and plate-shaped PEEKs are used as fillers. When the amount of each filler contained is 0.05 wt % or less, the liquid phase temperature is 270 to 272° C., and the temperature difference from the solid phase temperature is small. On the other hand, when the amount of filler contained exceeds 5.0 wt %, the liquid phase temperature is 275° C. or higher, and the temperature difference from the solid phase temperature is expanded to 5° C. or greater. At a temperature between the liquid phase temperature and the solid phase temperature, the solid phase and the liquid phase coexist. Therefore, when the temperature difference between the liquid phase temperature and the solid phase temperature is 5° C. or greater, the workability of a bonding material is poor, resulting in reduced productivity in a manufacturing premise. For the reasons described above, it is desirable that the filler content is 5 wt % or less. On the other hand, when the filler content is less than 0.05 wt %, the wettability between a molten bonding material and an electrode or the like is poor. Therefore, it is desirable that the filler content is 0.05 wt % or greater. In this embodiment, fillers having an average particle diameter of 30 μm were used. This applies to the embodiments given below.

Figure 7:
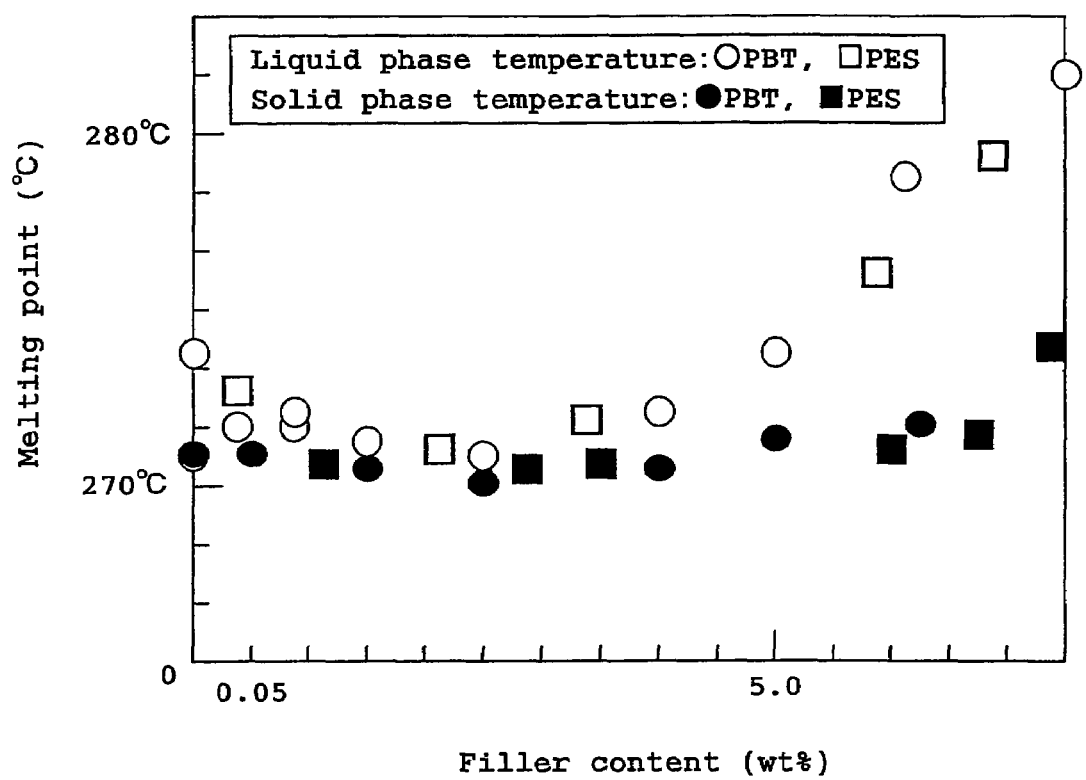
FIG. 7 is a graph showing the relationship between the filler content and the melting point of a ternary alloy of Bi, Cu and Ge.

FIG. 7 shows the relationship between the filler content (wt %) in a ternary alloy of Bi, Cu and Ge (Bi—Cu—Ge alloy) and the melting point (liquid phase temperature or solid phase temperature) of the Bi—Cu—Ge alloy. Needle-shaped PBT and needle-shaped PES are used as fillers. When the amount of each filler contained is 0.05 wt % or less, the liquid phase temperature is 270 to 272° C., and the temperature difference from the solid phase temperature is small. On the other hand, when the amount of filler contained exceeds 5.0 wt %, the liquid phase temperature is 275° C. or higher, and the temperature difference from the solid phase temperature is expanded to 5° C. or greater. At a temperature between the liquid phase temperature and the solid phase temperature, the solid phase and the liquid phase coexist. Therefore, when the temperature difference between the liquid phase temperature and the solid phase temperature is 5° C. or greater, the workability of a bonding material is poor, resulting in reduced productivity in a manufacturing premise. For the reasons described above, it is desirable that the filler content is 5 wt % or less. On the other hand, when the filler content is less than 0.05 wt %, the wettability between the bonding material when molten and an electrode or the like is poor. Therefore, it is desirable that the filler content is 0.05 wt % or greater.

Figure 8:
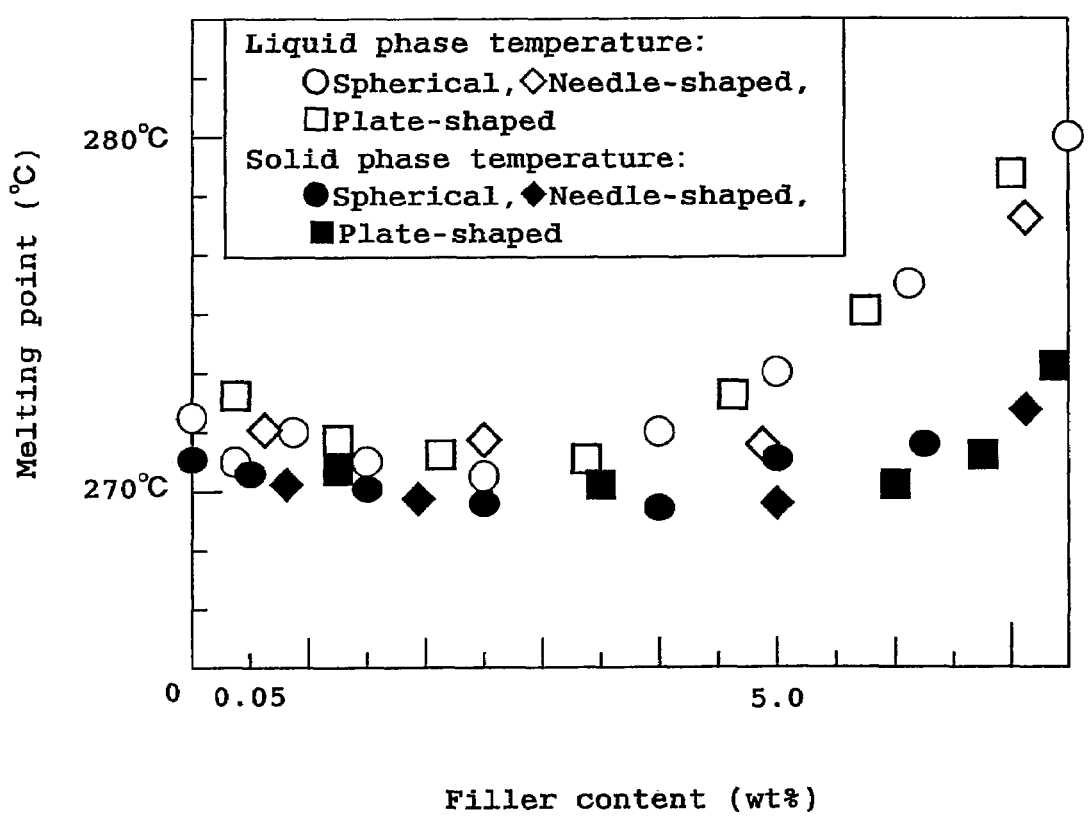
FIG. 8 is a graph showing the relationship between the filler content and the melting point of a ternary alloy of Bi, Cu and Ge.

FIG. 8 shows the relationship between the filler content (wt %) in a ternary alloy of Bi, Cu and Ge (Bi—Cu—Ge alloy) and the melting point (liquid phase temperature or solid phase temperature) of the Bi—Cu—Ge alloy. Spherical, needle-shaped and plate-shaped glasses are used as fillers. When the amount of each filler contained is 0.05 wt % or less, the liquid phase temperature is 270 to 272° C., and the temperature difference from the solid phase temperature is small. On the other hand, when the amount of filler contained exceeds 5.0 wt %, the liquid phase temperature is 275° C. or higher, and the temperature difference from the solid phase temperature is expanded to 5° C. or greater. At a temperature between the liquid phase temperature and the solid phase temperature, the solid phase and the liquid phase coexist. Therefore, when the temperature difference between the liquid phase temperature and the solid phase temperature is 5° C. or greater, the workability of a bonding material is poor, resulting in reduced productivity in a manufacturing premise. For the reasons described above, it is desirable that the filler content is 5 wt % or less. On the other hand, when the filler content is less than 0.05 wt %, the wettability between the bonding material when molten and an electrode or the like is poor.

Therefore, it is desirable that the filler content is 0.05 wt % or greater.

Figure 9:
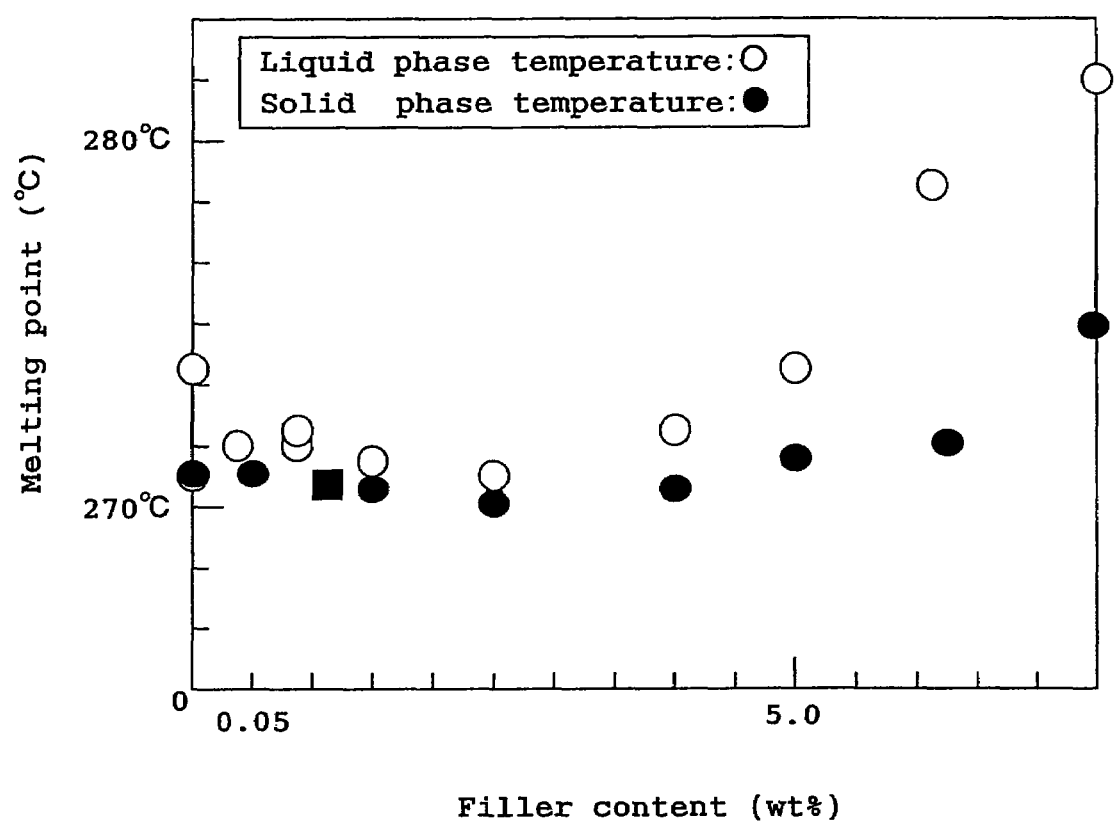
FIG. 9 is a graph showing the relationship between the filler content and the melting point of a ternary alloy of Bi, Cu and Ge.

FIG. 9 shows the relationship between the filler content (wt %) in a ternary alloy of Bi, Cu and Ge (Bi—Cu—Ge alloy) and the melting point (liquid phase temperature or solid phase temperature) of the Bi—Cu—Ge alloy. Diatomaceous earth montmorillonite, which is a spherical filler, is used as a filler. When the filler content is 0.05 wt % or less, the liquid phase temperature is 270 to 272° C., and the temperature difference from the solid phase temperature is small. On the other hand, when the filler content exceeds 5.0 wt %, the liquid phase temperature is 275° C. or higher, and the temperature difference from the solid phase temperature is expanded to 5° C. or greater. At a temperature between the liquid phase temperature and the solid phase temperature, the solid phase and the liquid phase coexist. Therefore, when the temperature difference between the liquid phase temperature and the solid phase temperature is 5° C. or greater, the workability of a bonding material is poor, resulting in reduced productivity in a manufacturing premise. For the reasons described above, it is desirable that the filler content is 5 wt % or less. On the other hand, when the filler content is less than 0.05 wt %, the wettability between the bonding material when molten and an electrode or the like is poor. Therefore, it is desirable that the filler content is 0.05 wt % or greater.

Figure 10:
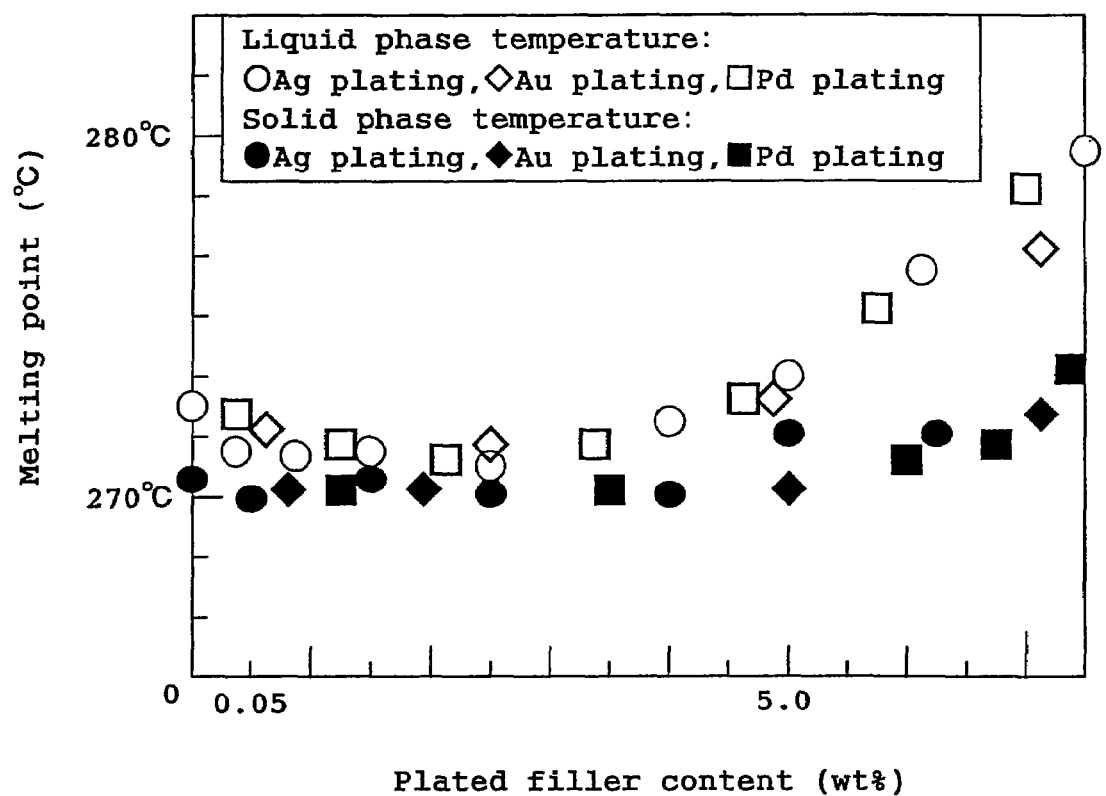
FIG. 10 is a graph showing the relationship between the filler content (wt %) and the melting point of a ternary alloy of Bi, Cu and Ge.

FIG. 10 shows the relationship between the filler content (wt %) in a ternary alloy of Bi, Cu and Ge (Bi—Cu—Ge alloy) and the melting point (liquid phase temperature or solid phase temperature) of the Bi—Cu—Ge alloy. Plated fillers in which Ag plating, Au plating or Pd plating has been performed on silica, which is a spherical filler, are used as fillers. When the filler content is 0.05 wt% or less, the liquid phase temperature is 270 to 272° C., and the temperature difference from the solid phase temperature is small. On the other hand, when the filler content exceeds 5.0 wt %, the liquid phase temperature is 275° C. or higher, and the temperature difference from the solid phase temperature is expanded to 5° C. or greater. At a temperature between the liquid phase temperature and the solid phase temperature, the solid phase and the liquid phase coexist. Therefore, when the temperature difference between the liquid phase temperature and the solid phase temperature is 5° C. or greater, the workability of a bonding material is poor, resulting in reduced productivity in a manufacturing premise. For the reasons described above, it is desirable that the filler content is 5 wt % or less. On the other hand, when the filler content is less than 0.05 wt %, the wettability between the bonding material when molten and an electrode or the like is poor. Therefore, it is desirable that the filler content is 0.05 wt % or greater.

Figure 11:
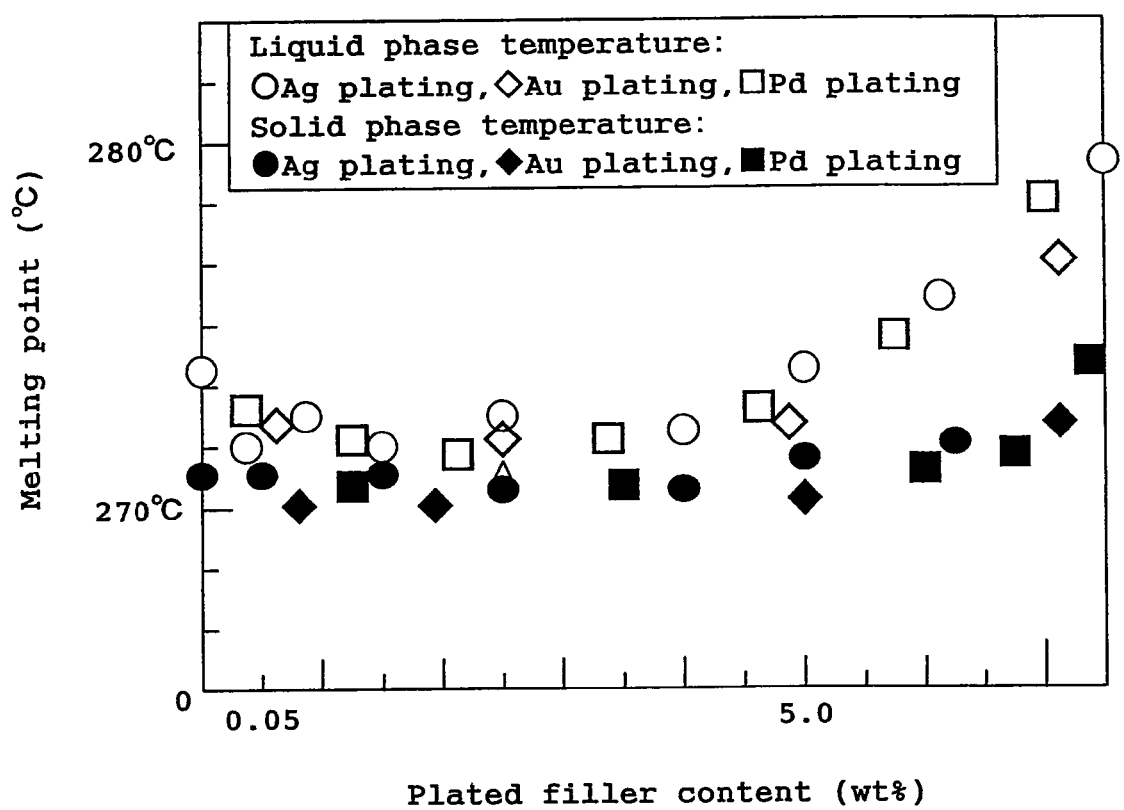
FIG. 11 is a graph showing the relationship between the filler content and the melting point of a ternary alloy of Bi, Cu and Ge.
Figure 12:
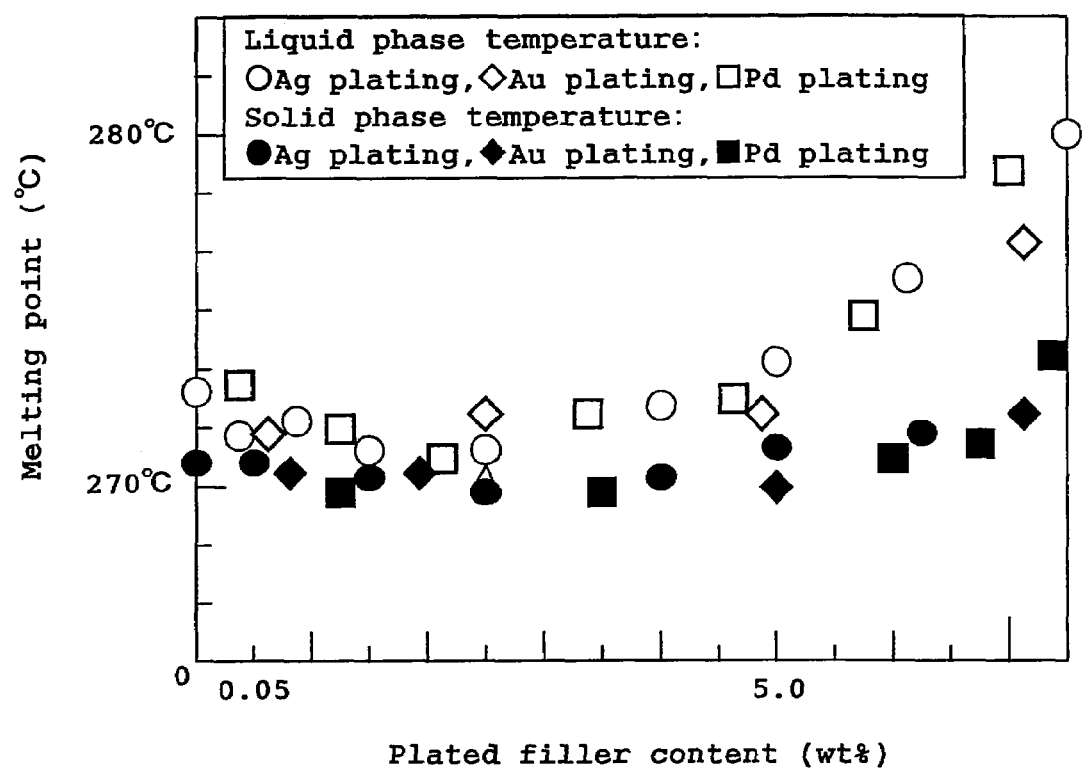
FIG. 12 is a graph showing the relationship between the filler content and the melting point of a ternary alloy of Bi, Cu and Ge.

FIG. 11 and FIG. 12 show, when fillers that have been plated (hereinafter referred to as "plated fillers") are contained in the bismuth alloy (1), the relationship between the plated filler content and the melting point of the bismuth alloy (1). FIG. 11 shows the relationship between the plated filler content (wt %) in a ternary alloy of Bi, Cu and Ge (Bi—Cu—Ge alloy) and the melting point (liquid phase temperature or solid phase temperature) of the Bi—Cu—Ge alloy. Plated fillers in which Ag plating, Au plating or Pd plating has been performed on a spherical filler composed of PBT are used as fillers. When the amount of each filler contained is 0.05 wt % or less, the liquid phase temperature is 270 to 272° C., and the temperature difference from the solid phase temperature is small. On the other hand, when the filler content exceeds 5.0 wt %, the liquid phase temperature is 275° C. or higher, and the temperature difference from the solid phase temperature is expanded to 5° C. or greater. At a temperature between the liquid phase temperature and the solid phase temperature, the solid phase and the liquid phase coexist. Therefore, when the temperature difference between the liquid phase temperature and the solid phase temperature is 5° C. or greater, the workability of a bonding material is poor, resulting in reduced productivity in a manufacturing premise. For the reasons described above, it is desirable that the filler content is 5 wt% or less. On the other hand, when the filler content is less than 0.05 wt %, the wettability between the bonding material when molten and an electrode or the like is poor. Therefore, it is desirable that the filler content is 0.05 wt % or greater.

FIG. 12 shows the relationship between the plated filler content (wt %) in a ternary alloy of Bi, Cu and Ge (Bi—Cu—Ge alloy) and the melting point (liquid phase temperature or solid phase temperature) of the Bi—Cu—Ge alloy. Plated fillers in which Ag plating, Au plating or Pd plating has been performed on a spherical filler composed of PES are used as fillers. When the amount of each filler contained is 0.05 wt % or less, the liquid phase temperature is 270 to 272° C., and the temperature difference from the solid phase temperature is small. On the other hand, when the filler content exceeds 5.0 wt %, the liquid phase temperature is 275° C. or higher, and the temperature difference from the solid phase temperature is expanded to 5° C. or greater. At a temperature between the liquid phase temperature and the solid phase temperature, the solid phase and the liquid phase coexist. Therefore, when the temperature difference between the liquid phase temperature and the solid phase temperature is 5° C. or greater, the workability of a bonding material is poor, resulting in reduced productivity in a manufacturing premise. For the reasons described above, it is desirable that the filler content is 5 wt % or less. On the other hand, when the filler content is less than 0.05 wt %, the wettability between the bonding material when molten and an electrode or the like is poor. Therefore, it is desirable that the filler content is 0.05 wt % or greater.

[Electronic Component]

The electronic component of the present invention is characterized in including an electronic element, an electrode connected to the electronic element, and an electronic element bonding material that bonds the electronic element and the electrode, and the electronic element bonding material is the bonding material (1) or the bonding material (2) of the present invention.

In the electronic component of the present invention, those that are commonly used in this technical field can be used as electronic elements, and examples may be those that are composed of a capacitor, resistor, transistor, SOP (side outer-lead package), QFP (quad flat package), coil, bare chip, wire rod, plate material, and the like.

The electronic component of the present invention can be used in the same manner as the conventional electronic components. Specifically, the electronic component can be preferably used as, for example, a surface mount component, modular component, insertion component, BGA (ball grid array) and the like. Examples of surface mount components include chip components such as chip inductors, chip capacitors and the like. Examples of modular components include PA (power amp) modules, VCO (voltage controlled oscillator) modules and the like. Examples of insertion components include axial components, radial components and the like. The configuration of the electronic component of the present invention is particularly suitable for obtaining an electronic component of a size preferably 8 mm×5 mm or smaller, and more preferably 4.5 mm×3.2 mm or smaller, that has a heat capacity. Moreover, the configuration of the electronic component of the present invention is suitable for obtaining an electronic component in which an electronic element is bonded to an electrode with a bonding material such as solder or the like.

Figure 13:
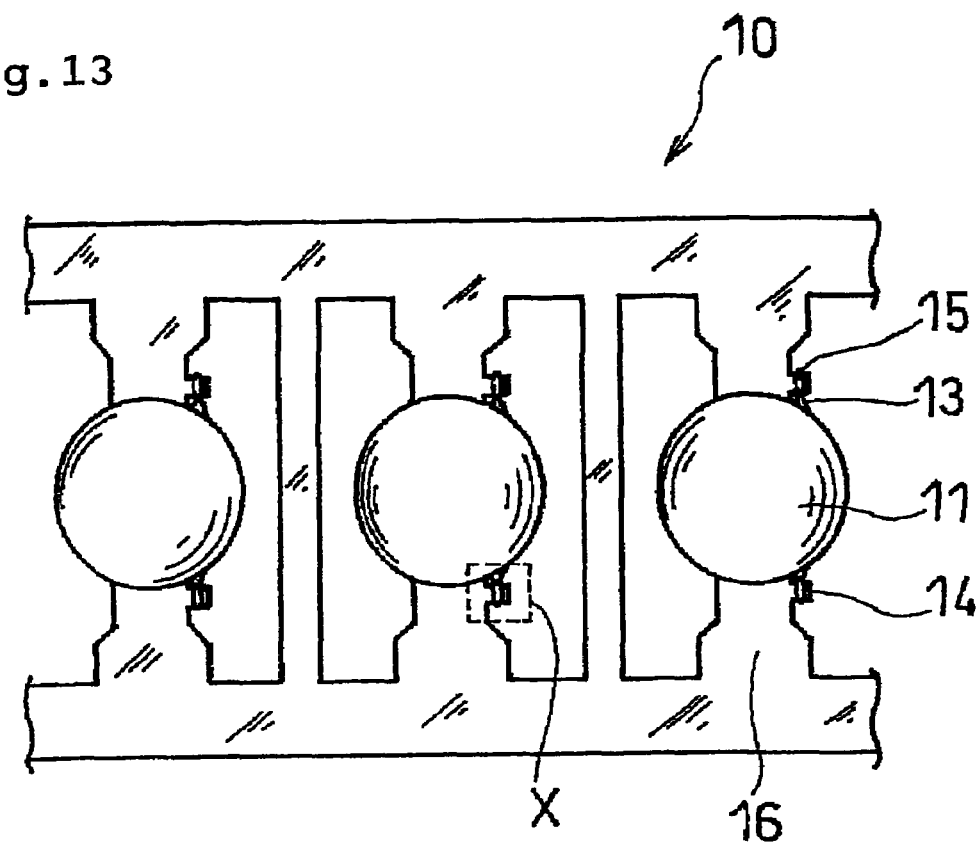
FIG. 13 is a longitudinal sectional view schematically showing the configuration of a chip inductor of the first embodiment in connection with the electronic component of the present invention.
Figure 14:
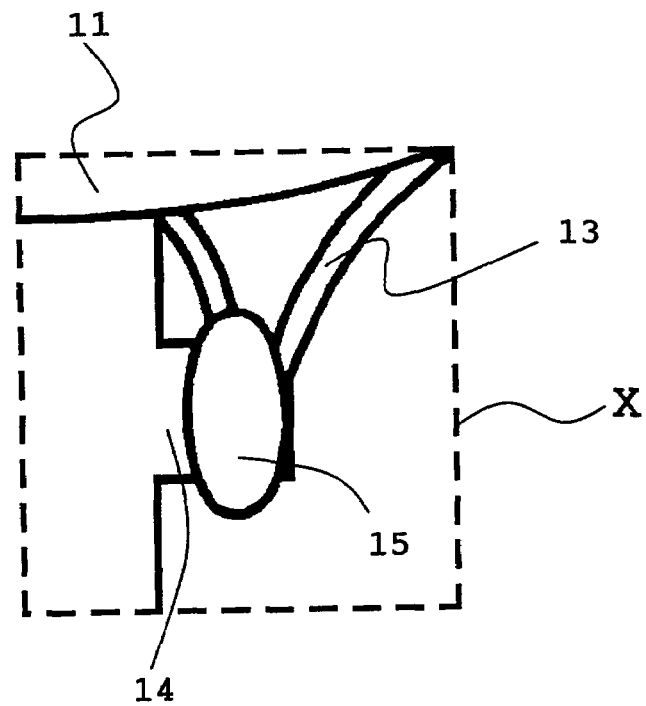
FIG. 14 is a longitudinal sectional view showing in close-up the configuration of a relevant part of the chip inductor shown in FIG. 13.

FIG. 13 is a longitudinal sectional view schematically showing the configuration of a chip inductor 10 of the first embodiment in connection with the electronic component of the present invention. FIG. 14 is a longitudinal sectional view showing in close-up the configuration of a relevant part of the chip inductor 10 shown in FIG. 13. Specifically, FIG. 14 is a longitudinal sectional view showing in close-up the area enclosed by a broken line X in FIG. 13. The chip inductor 10 has the same configuration as a commercially available chip inductor (3225 FA type: 3.2 mm x 2.5 mm x 2.2 mm, manufactured by Matsushita Electric Industrial Co., Ltd.).

That is, the chip inductor 10 includes a ferrite core 11, a coiled copper wire 13, an electrode terminal 14, an electronic element bonding material 15 and an electrode frame 16, and is used after being mounted on, for example, an unshown motherboard. The ferrite core 11 is made of a magnetic material and attached to the electrode frame 16 using an adhesive. The coiled copper wire 13 is an end of an electronic element and is wound around the ferrite core 11. A portion thereof is hooked on the electrode terminal 14, which is in continuation with the electrode frame 16. The electronic element bonding material 15 is an electronic element bonding material that bonds the coiled copper wire 13, which is an end of the electronic element, and the electrode terminal 14 and secures both components such that the connection of the coiled copper wire 13 and the electrode terminal 14 can be maintained. The bonding material (1) or (2) is used for the electronic element bonding material 15.

Figure 15:
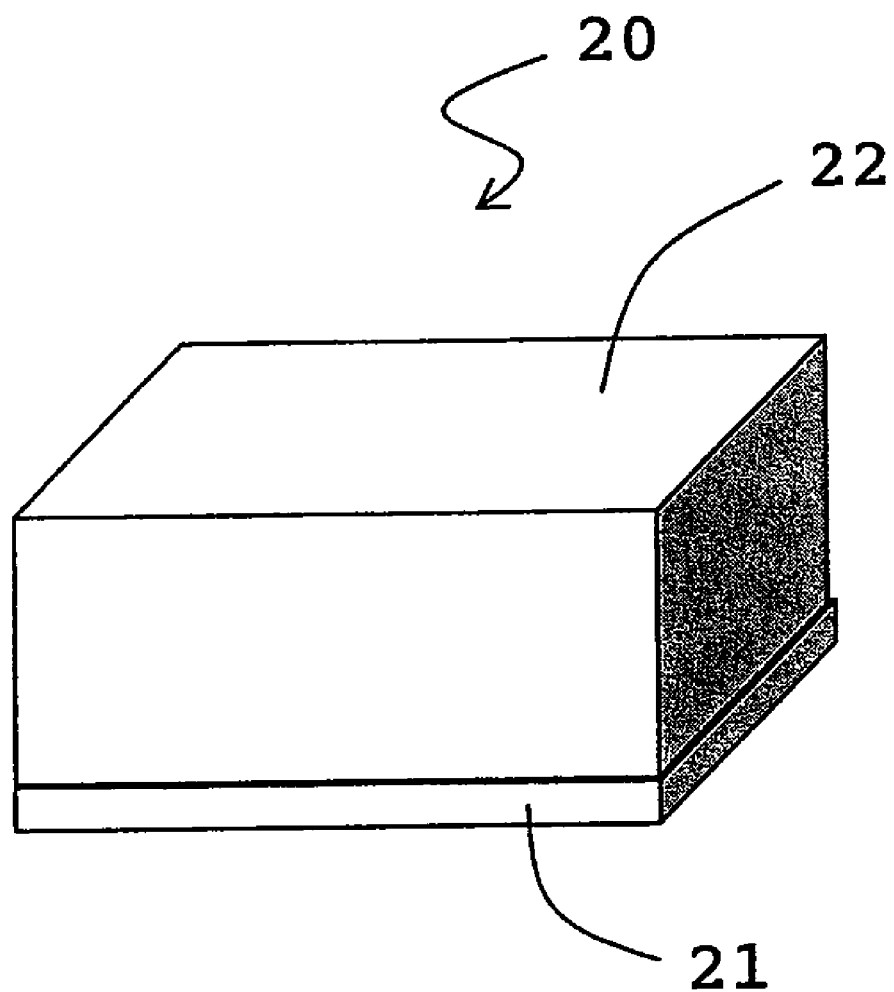
FIG. 15 is a perspective view schematically showing the configuration of a PA module of the second embodiment in connection with the electronic component of the present invention.
Figure 16:
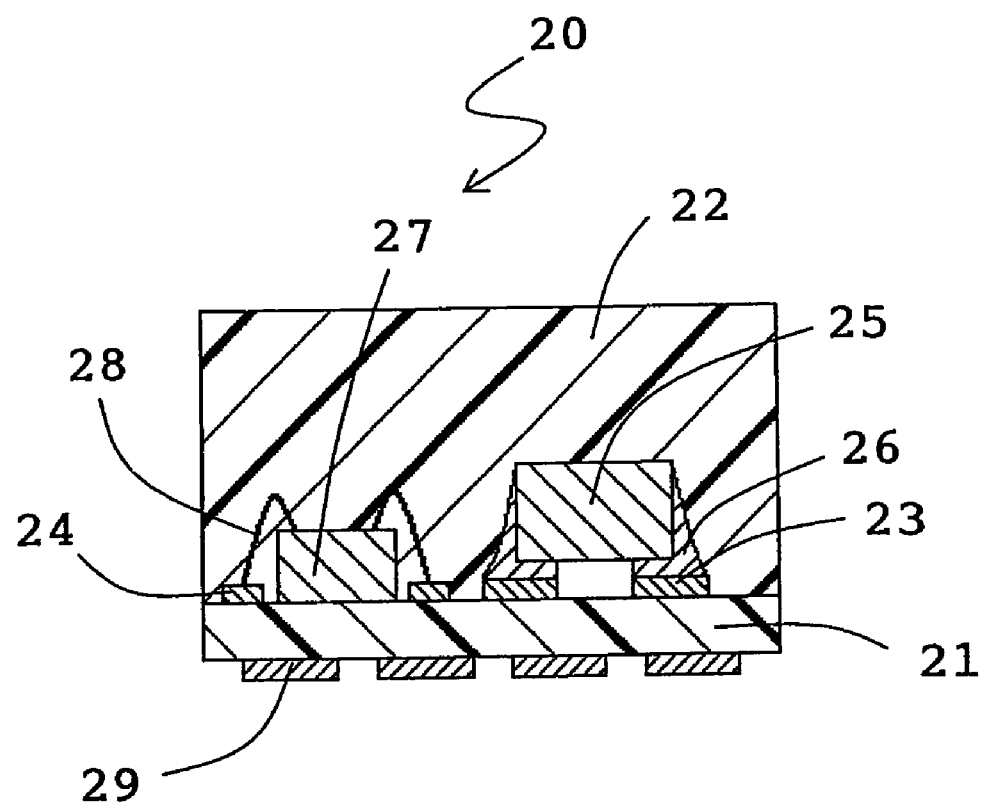
FIG. 16 is a longitudinal sectional view schematically showing the internal structure of the PA module shown in FIG. 15.

FIG. 15 is a perspective view schematically showing the configuration of a PA module 20 of the second embodiment in connection with the electronic component of the present invention. FIG. 16 is a longitudinal sectional view schematically showing the internal structure of the PA module 20 shown in FIG. 15. The PA module 20 has the same configuration as a commercially available PA module (PAM type, 5 mm×5 mm×1.5 mm, manufactured by Matsushita Electric Industrial Co., Ltd.) except that an electronic element bonding material containing the bonding material (1) or (2) is used as a bonding material 26.

That is, the PA module 20 includes a substrate 21, a sealing agent 22, internal electrodes 23 and 24, a chip capacitor 25, an electronic element bonding material 26, a semiconductor component 27 and a wire rod 28. A glass epoxy board, for example, is used for the substrate 21. The sealing agent 22 protects various electronic components provided on a surface of the substrate 21 to be in an electrically insulated state. An epoxy resin, for example, is used for the sealing agent 22. The internal electrodes 23 and 24 are provided on one surface of the substrate 21. The chip capacitor 25 is an electronic element and is bonded to the internal electrode 23 using the electronic element bonding material 26. The bonding material (1) or (2) is used for the electronic element bonding material 26. The semiconductor component 27 is connected to the internal electrode 24 using the wire rod 28. The PA module 20 is bonded to an exterior electrode 29 provided on an unshown motherboard surface so as to be mounted on the motherboard, thereby giving the bonded structure of the present invention. Various bonding materials can be used to bond the PA module 20 to the exterior electrode 29.

Furthermore, in the electronic component of the present invention, Sn may be incorporated into the electronic element bonding material. It is desirable that the amount of Sn incorporated into the electronic element bonding material is preferably 40 wt % or less of the total amount of the electronic element bonding material and Sn, and more preferably 20 wt % or less of the total amount of the electronic element bonding material and Sn. By controlling the amount of Sn incorporated to 40 wt % or less, the bonding strength of an electronic element and electrode is maintained at a high level, the reliability of the electronic component of the present invention, in particular the reliability in bonding the electronic component and a motherboard, the reliability in long-term use under high temperatures, and like reliability can be enhanced. Reasons for the incorporation of Sn into the electronic element bonding material may be those presented in (i) to (v) below. Two or more of the reasons presented in (i) to (v) may sometimes be applicable simultaneously.

(i) An electronic element bonding material contains Sn as an unavoidable impurity.

(ii) Plating is performed on the surface of an electronic element, and this plating contains Sn.

(iii) Plating is performed on the surface of an electrode, and this plating contains Sn.

(iv) An electronic element itself contains Sn.

(v) An electrode itself contains Sn.

In the cases of (ii) to (v), when bonding an electronic element to an electrode, when bonding an electronic component to a motherboard, or in a like instance, Sn contained in the plating or Sn contained in the electronic element or the electrode is released due to the heat during bonding and is likely to be incorporated into the electronic element bonding material. For example, in order to attain the amount of Sn incorporated of 40 wt % or less in the case of (iv), it is only necessary to control the Sn content of a plating such that the total amount of Sn in the plating is 40 wt % or less of the total amount of the electronic element bonding material. Moreover, when (iv) and (v) are simultaneously applicable, it is only necessary to control the Sn content of each plating such that the total amount of Sn in the platings is 40 wt % or less of the total amount of the electronic element bonding material. Further, in (ii), when the plating on the surface of the electronic element is composed of Sn, the amount of Sn incorporated into the electronic element bonding material can be 40 wt % or less also by suitably controlling the thickness of the plating layer.

Figure 17:
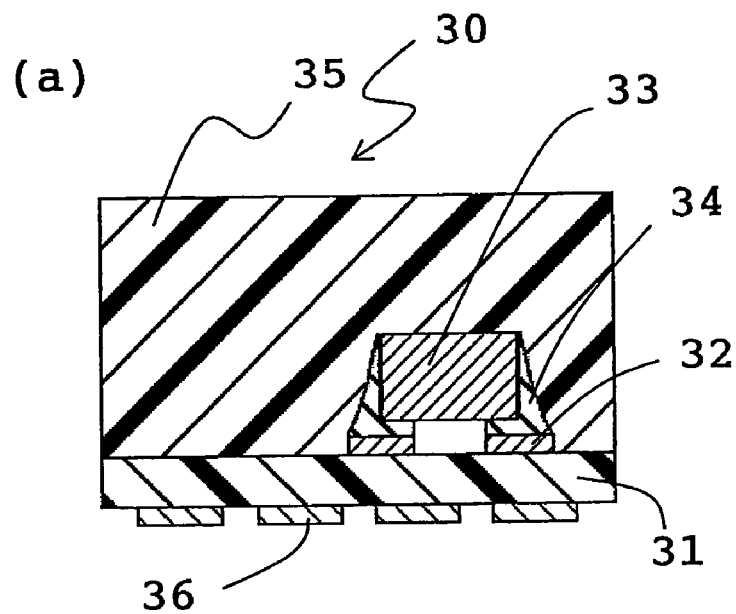
FIG. 17 is a drawing showing the configuration of an electronic component of the third embodiment in connection with the electronic component of the present invention.
Figure 17:
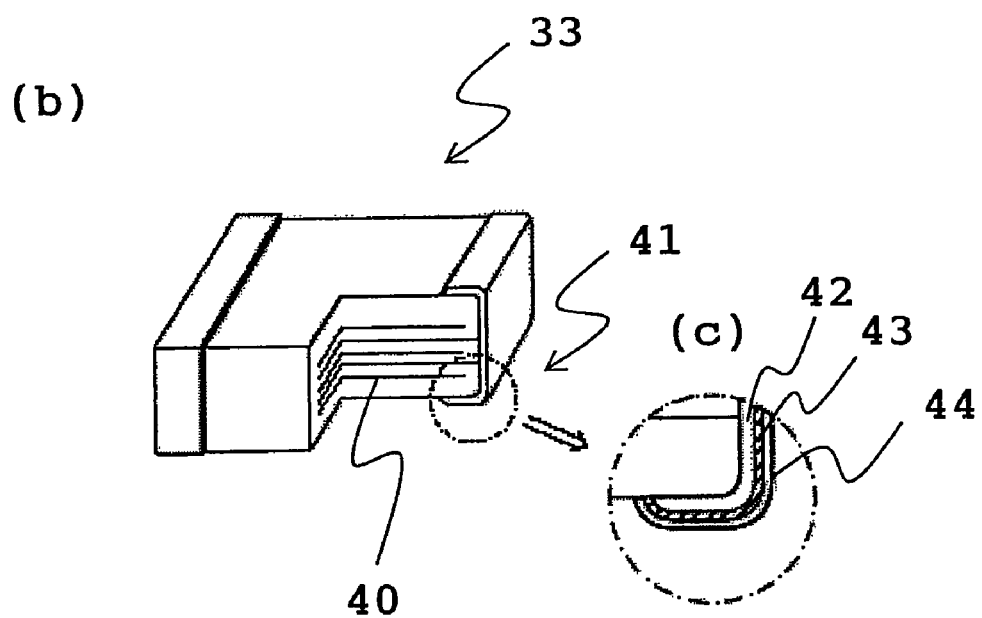

FIG. 17 is a drawing showing the configuration of an electronic component 30 of the third embodiment in connection with the electronic component of the present invention. FIG. 17(a) is a longitudinal sectional view schematically showing the configuration of the electronic component 30. FIG. 17(b) is a perspective view showing the configuration of a chip capacitor 33 included in the electronic component 30 shown in FIG. 17(a). In FIG. 17(b), the internal structure of the chip capacitor 33 is shown as a partial longitudinal sectional view. FIG. 17(c) is a longitudinal sectional view showing in close-up the configuration of the portion enclosed by a broken line in FIG. 17(b).

The electronic component 30 includes a substrate 31, an internal electrode 32, a chip capacitor 33, an electronic element bonding material 34 and a sealing agent 35. A glass epoxy board, for example, is used for the substrate 31. The internal electrode 32 is provided on a surface of the substrate 31. The chip capacitor 33 is an electronic element and is bonded to the internal electrode 32 using the electronic element bonding material 34. The chip capacitor 33 includes a dielectric ceramic 40 and an electrode unit 41. In this embodiment, the dielectric ceramic 40 is fabricated in the shape of a nearly rectangular parallelepiped. The electrode unit 41 includes a bottom electrode 42 containing Ag as the main component, an intermediate electrode 43 containing Ni as the main component, and an exterior electrode 44 containing Sn as the main component, and these electrodes are layered in this order. The bottom electrode 42 is provided so as to be in contact with one surface of the dielectric ceramic 40 that is in the shape of a rectangular parallelepiped. In this embodiment, the chip capacitor 33 has a size of 1.0 mm×0.5 mm×0.5 mm. Moreover, in this embodiment, the exterior electrode 44 of the electrode unit 41 is provided as an Sn plating layer. The bonding material (1) or (2) is used for the electronic element bonding material 34. The sealing agent 35 encapsulates and packs the chip capacitor 33 on the substrate 31. An epoxy resin, for example, is used for the sealing agent 35. The electronic component 30 is bonded using the bonding material to an exterior electrode 36 provided on an unshown motherboard to be mounted on the motherboard, thereby giving the bonded structure of the present invention.

The chip capacitor 33 is bonded to the internal electrode 32 provided on the substrate 31 using the electronic element bonding material 34 by heating to 270° C., which is the melting temperature of the bonding material 34, or higher in a reflow furnace. Since Sn whose melting temperature is 230° C. is contained as the main component in the exterior electrode 44 of the chip capacitor 33, Sn is molten by the heat in the reflow furnace, and molten Sn is incorporated into the electronic element bonding material 34. A low-melting composition (Sn-58% Bi, melting temperature: 138° C.) composed of Sn and Bi is thereby generated in the electronic element bonding material 34 after cooling.

Figure 18:
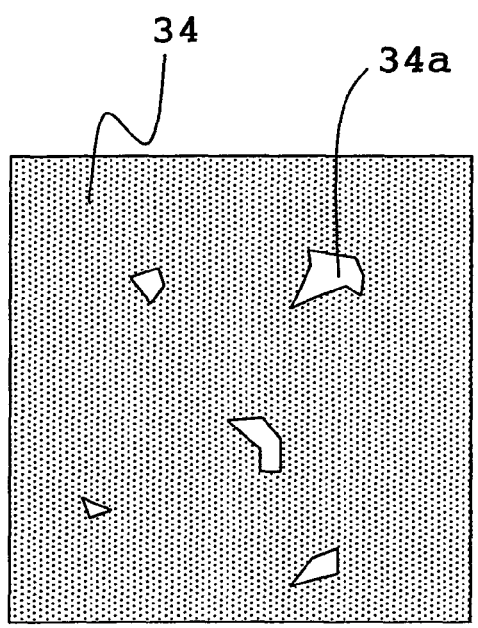
FIG. 18 is a drawing schematically showing the metallic structure of the bonding material of the present invention into which Sn is molten and incorporated.
Figure 18:
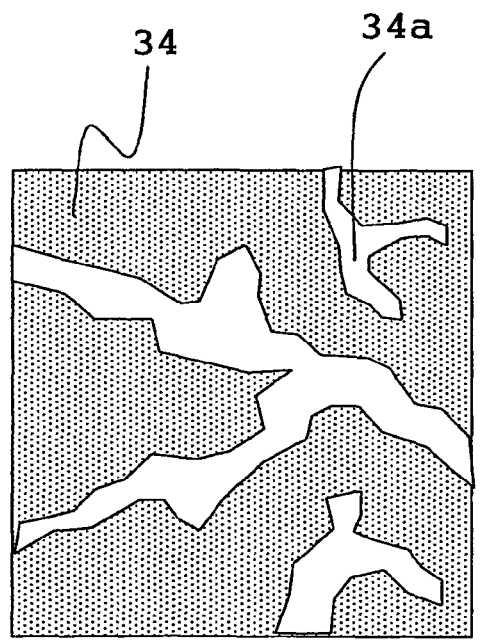

FIG. 18 is a drawing schematically showing the metallic structure of the electronic element bonding material 34 into which Sn is incorporated. When the amount of Sn incorporated (mixing amount) is small, as shown in FIG. 18(a), the inside of the electronic element bonding material 34 is dotted with a low-melting composition 34a composed of Sn and Bi like islands. When the electronic element bonding material 34 having this metallic structure is reheated to 150° C., the low-melting composition 34a is molten but the electronic element bonding material 34 itself does not melt, and therefore the bonding of the chip capacitor 33 and the internal electrode 32 provided on the substrate 31 is maintained in a good condition. However, when the amount of Sn incorporated is large, as shown in FIG. 18(*b*), the low-melting composition 34*a* composed of Sn and Bi is present inside the electronic element bonding material 34 in the form of a continuous block. When the electronic element bonding material 34 having this metallic structure is reheated to 138° C. or higher, the low-melting composition 34*a* in the form of a block is molten, and therefore the bonding of the chip capacitor 33 and the internal electrode 32 provided on the substrate 31 is broken, and the low-melting composition 34*a* is molten and appears on the substrate 31, creating a short circuit with an adjacent internal electrode.

Figure 19:
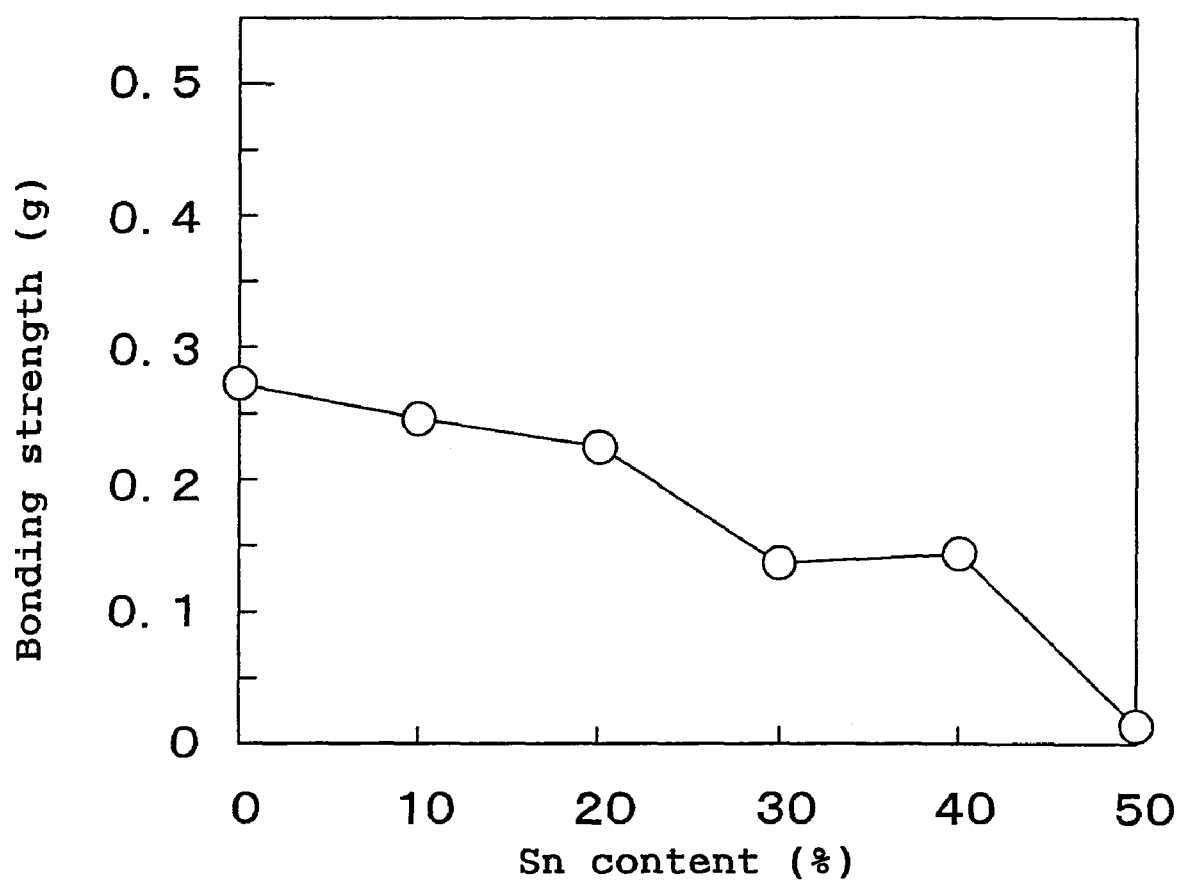
FIG. 19 is a graph showing the relationship between the amount of Sn incorporated and the bonding strength in an electronic element bonding material.

FIG. 19 is a graph showing the relationship between the amount of Sn incorporated (content) and the bonding strength in an electronic element bonding material. It can be understood that when the Sn content exceeds 40 wt %, bonding strength is drastically decreased. This shows that when the Sn content exceeds 40 wt %, the low-melting composition 34*a*, which is otherwise scattered like islands, takes the form of a continuous block. Therefore, the amount of Sn contained in the plating on the surface of the electronic element, contained in the plating of the electrode surface connected to the electronic element, and contained in the electronic element bonding material is preferably 40 wt % or less, and more preferably 20 wt % or less, of the bonding material. In the case of a chip capacitor having a size of 1.0 mm×0.5 mm×0.5 mm, when the thickness of the exterior electrode is controlled to 2 μm or less, the amount of Sn relative to the electronic element bonding material is 40 wt % or less, and when the thickness of exterior electrode is controlled to 1 μm or less, the amount of Sn relative to the electronic element bonding material is 20 wt % or less. Therefore, in this embodiment, the thickness of the Sn plating of the electronic element and the electrode surface is preferably 2 μm or less, and more preferably 1 μm or less.

The aforementioned results can be considered as the upper limits in a case where Sn is contained in advance in the electronic element bonding material. The results show that when the amount of Sn contained in advance in the electronic element bonding material is 40 wt % or less (for example, Bi-0.6% Cu-0.04% Ge-40% Sn), the electronic component does not undergo deterioration of bonding strength, and when the amount of Sn is 20 wt % or less (for example, Bi-0.6% Cu-0.04% Ge-20% Sn), the electronic component is further desirable.

Figure 20:
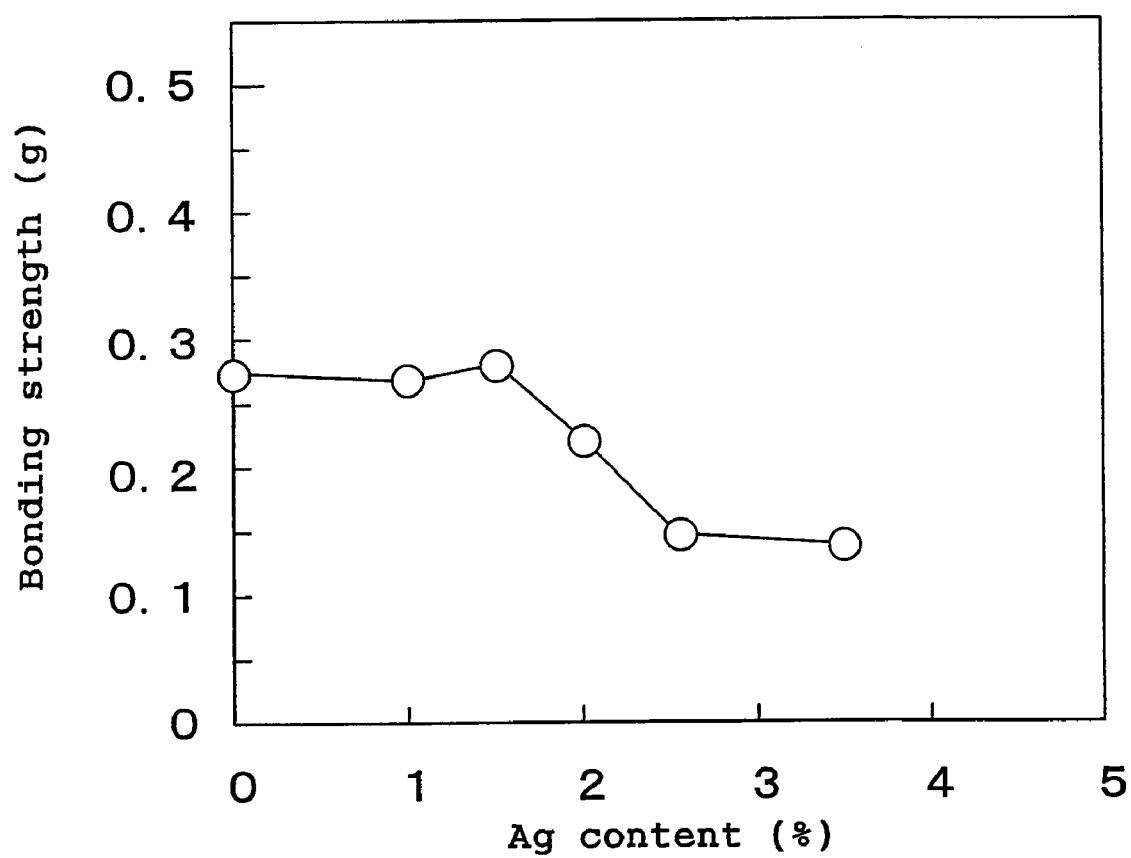
FIG. 20 is a graph showing the relationship between the amount of Ag incorporated and the bonding strength in an electronic element bonding material.

Besides Sn, there is a similar tendency with respect to Ag. FIG. 20 a graph showing the relationship, when Ag is incorporated into the aforementioned electronic element bonding material, between the Ag content (wt %) relative to the electronic element bonding material and the bonding strength. When the Ag content relative to the electronic element bonding material exceeds 2 wt %, bonding strength is drastically decreased. This shows that when the Ag content exceeds 2 wt %, the low-melting composition, which is otherwise scattered like islands, takes the form of a continuous block. Therefore, the amount of Ag contained in the plating on the surface of the electronic element and contained in the electronic element bonding material is preferably 2 wt % or less, and more preferably 1.5 wt % or less, of the electronic element bonding material.

This can be considered also as the upper limit in case Ag is contained in advance in the electronic element bonding material. This shows that when the amount of Ag contained in advance in the electronic element bonding material is 2 wt % or less (for example, Bi-0.6% Cu-0.04% Ge-2% Ag), a bonded structure does not undergo deterioration of bonding strength, and when the amount of Ag is 1.5 wt % or less (for example, Bi-0.6% Cu-0.04% Ge-1.5% Ag), the bonded structure is further desirable.

[Bonded Structure]

The bonded structure of the present invention is characterized in including (a) the electronic component of the present invention, (b) a substrate on which the electronic component of the present invention is mounted and (c) the electronic component bonding material that bonds the electronic component of the present invention and the substrate.

The electronic component (a) of the present invention is an electronic component that has the same configuration as that described above. Specifically, it is an electronic component in which an electronic element is bonded to an electrode using an electronic element bonding material. The electronic element bonding material is the bonding material (1) or (2).

Various substrates that are conventionally used for mounting electronic components are usable as the substrate (b) on which the electronic component of the present invention is mounted.

The electronic component bonding material (c) is a bonding material having a melting temperature lower than that of the bismuth alloy (1) or (2) contained in the bonding material (1) or (2). It is preferable that the electronic component bonding material is molten by heating by a reflow device, and the electronic component bonding material has a melting temperature of, for example, 200 to 230° C. A large number of bonding materials that have such a melting temperature have been proposed and are readily available to a person skilled in the art.

The electronic element bonding material has a melting temperature higher than that of the electronic component bonding material. Therefore, even when a reflow device is used in mounting the electronic component on the motherboard, melting of the electronic element bonding material contained in the electronic component does not occur. A reliable bonded structure can thus be obtained.

[Electronic Device]

The electronic device of the present invention is characterized in that the control means thereof includes a circuit board that has the bonded structure of the present invention. The electronic device of the present invention has its operation controlled by the control means including the circuit board that has the bonded structure of the present invention. In other words, the electronic device of the present invention has the same configuration as conventional electronic devices except for including a circuit board that has the bonded structure of the present invention as at least a part of a control means.

Troubles resulting from disconnection, short circuit or the like in a circuit board are extremely unlikely to occur in the electronic device of the present invention since the electronic device includes a circuit board including a bonded structure that has very high reliability in the bonding of an electronic element and an electrode and in the bonding of an electronic component and a substrate. Therefore, the electronic device of the present invention can be suitably applied to a use in which long-term durability is required, a use in which high reliability is required over a long period of time, and a like use. Examples of uses in which long-term durability is required include electronic devices such as HDD recorders (hard disk recorders), digital cameras, laptop personal computers and the like, electric appliances such as flat-screen TVs, refrigerators, washing machines, air conditioners and the like. Examples of uses in which high reliability is required over a long period of time include large-scale computers, industrial robots, apparatuses installed in aircrafts and the like.

Figure 21:
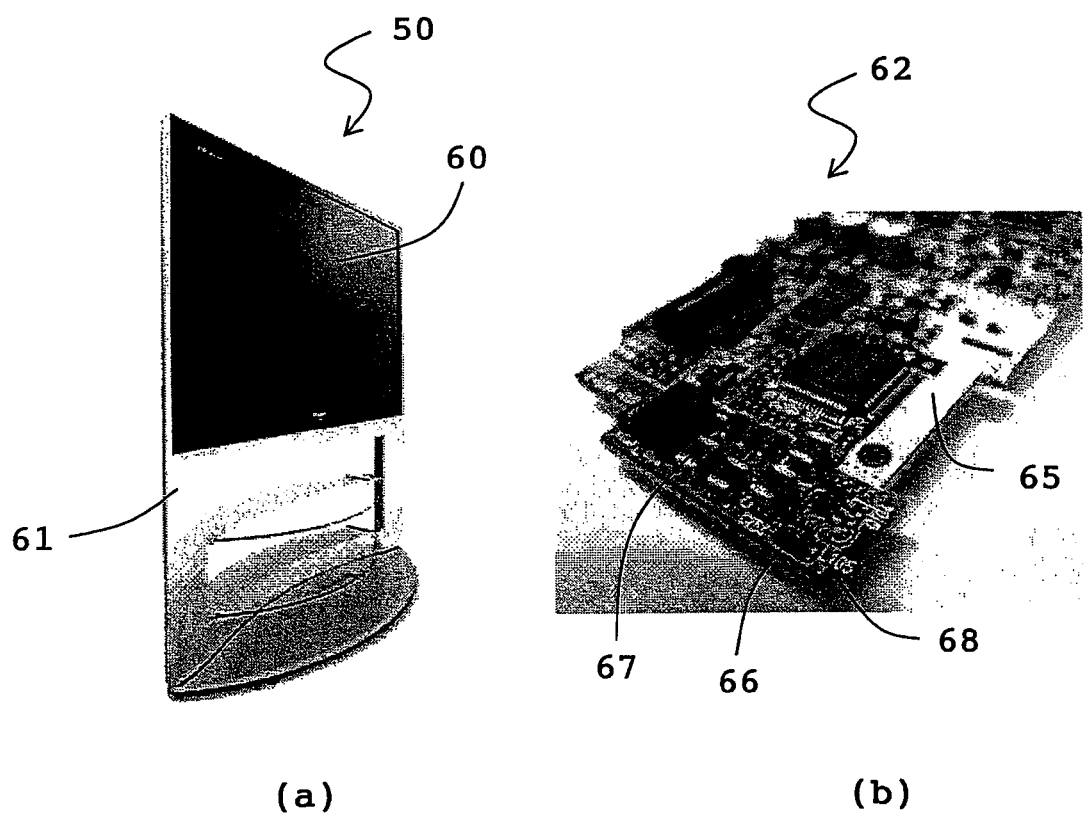
FIG. 21 is a perspective view showing the configuration of a flat-screen TV of the first embodiment in connection with the electronic device of the present invention.
Figure 22:
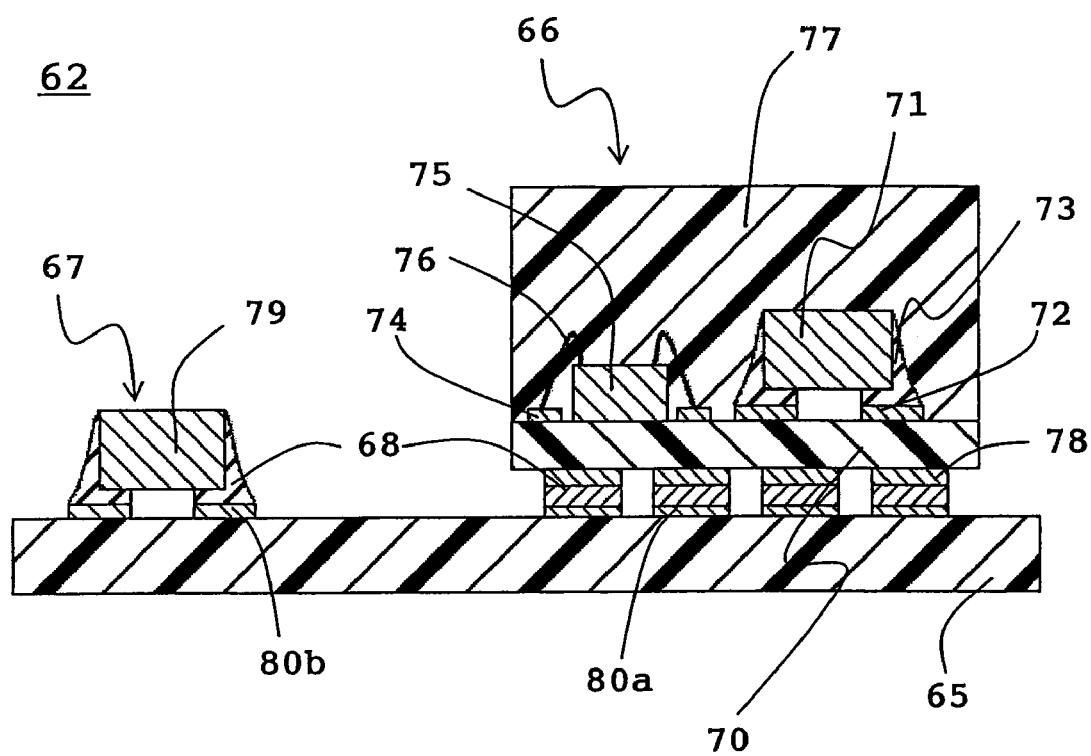
FIG. 22 is a longitudinal sectional view schematically showing the configuration of a circuit board installed in the flat-screen TV shown in FIG. 21.
Figure 23:
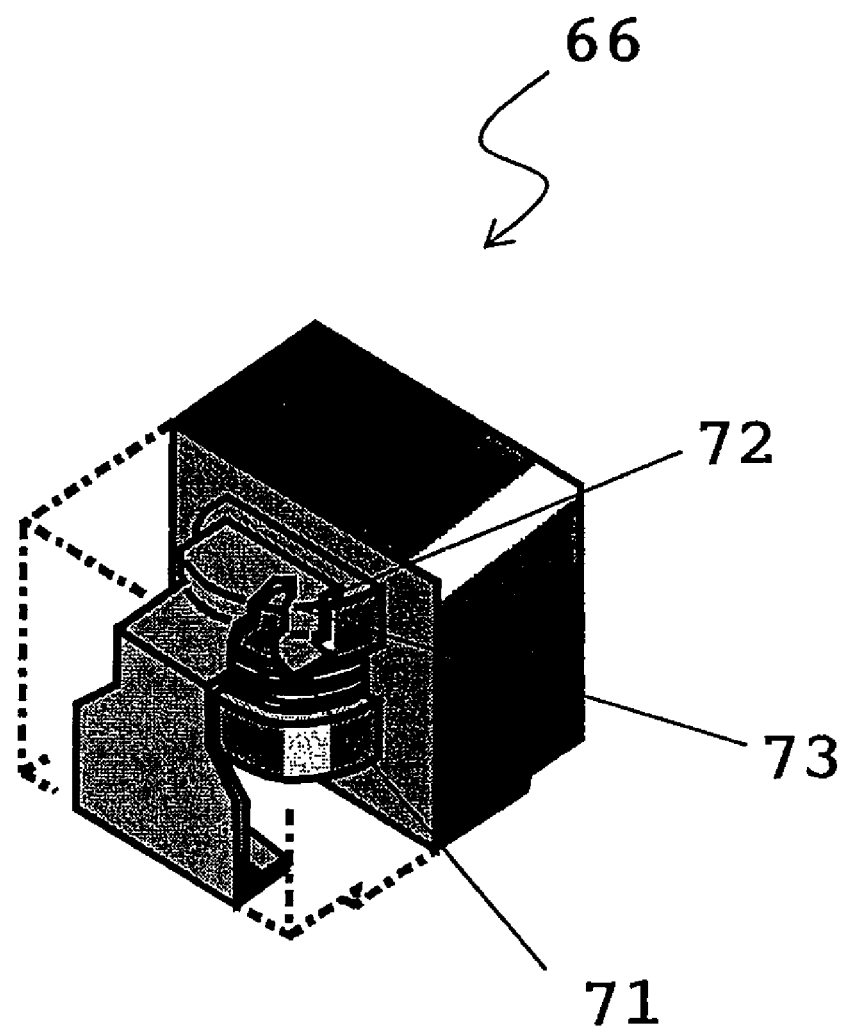
FIG. 23 is a perspective view schematically showing the configuration of a relevant part of an electronic component mounted on the circuit board shown in FIG. 22.

FIG. 21 is a perspective view showing the configuration of a flat-screen TV 50 of the first embodiment in connection with the electronic device of the present invention. FIG. 22 is a longitudinal sectional view schematically showing the configuration of a circuit board 62 installed in the flat-screen TV 50 shown in FIG. 21. FIG. 23 is a perspective view schematically showing the configuration of a relevant part of an electronic component 66 mounted on the circuit board 62 shown in FIG. 22.

The flat-screen TV 50 includes a plasma display panel 60, a casing 61 and a circuit board 62. The circuit board 62 is accommodated in the casing 61 and includes a glass epoxy board 65, a first electronic component 66, a second electronic component 67 and an electronic component bonding material 68. The glass epoxy board 65 is furnished with an electric wiring.

The first electronic component 66 is an electronic component in which bonding using an electronic element bonding material 73 has been performed. The first electronic component 66 includes a chip capacitor 71, which is an electronic element, a first internal electrode 72, the electronic element bonding material 73 and a semiconductor component 75. The chip capacitor 71 is bonded to the first internal electrode 72 using the electronic element bonding material 73. The first internal electrode 72 is provided on a surface of a module substrate 70. The bonding material (1) or (2) can be used for the electronic element bonding material 73. The semiconductor component 75 is connected to the second internal electrode 74 provided on a surface of the module substrate 70 using a wire rod 76. The first electronic component 66 is encapsulated by a sealing agent 77 on a surface of the module substrate 70. An epoxy resin, for example, can be used for the sealing agent 77.

The module substrate 70 on which the first electronic component 66 is mounted is mounted on the glass epoxy board 65 by bonding using the electronic component bonding material 68 an exterior electrode 78 provided on the surface on the side opposite the surface on which the first electronic component 66 is mounted and an electrode 80a provided on a surface of the glass epoxy board 65. Common solder materials that are regularly used in this technical field are usable for the electronic component bonding material 68, and examples include Sn-3 to 0.5 wt % Cu, Sn-3.5 wt % Ag-0.5 wt % Bi-8 wt % In, etc.

The second electronic component 67 is an electronic component in which bonding using the electronic element bonding material 73 is not performed. The second electronic component 67 includes an electronic element 79, an electrode 80b and the electronic component bonding material 68. The electronic element 79 is bonded to the electrode 80b provided on a surface of the glass epoxy board 65 using the electronic component bonding material 68. The second electronic component 67 is thereby mounted on the glass epoxy board 65.

When the first electronic component 66 is mounted on the glass epoxy board 65, bonding is performed by heating to the melting temperature of the electronic component bonding material 68 or higher in a reflow furnace. When the electronic component bonding material 68 is Sn-3 to 0.5 wt % Cu, the first electronic component 66 is heated to 260° C. In this instance, the temperature inside the first electronic component 66 also rises to around 260° C. However, the electronic element bonding material 73 has a high melting temperature of around 270° C. or higher. Therefore, even when heating is performed by a reflow device to mount the first electronic component 67 on the glass epoxy board 65, the electronic element bonding material 73 is not molten. As a result, the development of defects such as breakage of the bonding of the chip capacitor 71 and the internal electrode 72 as well as leakage of the molten bonding material and the resulting short circuit with an adjacent internal electrode is securely prevented, thereby enabling a highly reliable electronic device to be provided.

The electronic device of the present invention is controlled by a circuit board that has a bonded structure in which an electronic element and an electrode as well as an electronic component and a substrate are securely bonded. Moreover, the bonding of the electronic element and the electrode and the bonding of the electronic component and the substrate are maintained even after receiving some external impact. Therefore, the electronic device of the present invention has a very low defect rate in product manufacturing, is unlikely to develop a trouble during a long-term use, and is an electronic device of very high reliability. Furthermore, even if the electronic device of the present invention is accidentally disposed of in a natural environment, it does not release Pb or the like into the natural environment.

Industrial Applicability

The present invention inexpensively provides a bonding material that has a melting temperature of 270° C. or higher and excellent impact resistance, and that meets environmental standards. The bonding material of the present invention is preferably usable with an electronic component that has a small heat capacity such as a chip inductor, and is widely applicable to an electronic component that is mounted on a motherboard using a reflow device. Furthermore, once a bonded structure in which this electronic component is bonded to a motherboard is installed as a circuit board in an electronic device, an electronic device of excellent durability and high reliability can be obtained.

The invention claimed is:

1. A bonding material comprising a bismuth alloy, wherein the bismuth alloy consists of Cu, Ge, Bi and an unavoidable impurity with a Cu content of 0.2 to 0.8 wt %, a Ge content of 0.02 to 0.2 wt % and the remainder being Bi and the unavoidable impurity.

2. The bonding material in accordance with claim 1, further comprising at least one filler selected from the group consisting of spherical fillers, needle-shaped fillers and plate-shaped fillers, wherein a filler content is 0.05 to 5.0 wt %.

3. The bonding material in accordance with claim 2, wherein said filler comprises at least one material selected from the group consisting of resin materials, inorganic materials and metallic materials.

4. The bonding material in accordance with claim 2, wherein plating is performed on the surface of said filler, and said plating comprises at least one metal selected from the group consisting of Ag, Pd, Au and Sn.

5. An electronic component comprising:
an electronic element;
an electrode connected to said electronic element; and
an electronic element bonding material that bonds said electronic element and said electrode, wherein
said electronic element bonding material is the bonding material according to claim 1.

6. The electronic component in accordance with claim 5, wherein:
Sn is incorporated into said electronic element bonding material as an unavoidable impurity or incorporated into said electronic element bonding material from an Sn-containing plating formed on a surface of said electronic element, from an Sn-containing plating formed on a surface of said electrode, from said electronic element which contains Sn, or from said electrode which contains Sn, and an amount of Sn incorporated into said electronic element bonding material is more than 0 wt % and 40 wt % or less of the total amount of the electronic element bonding material and Sn.

7. A bonded structure comprising:
(a) an electronic component;
(b) a substrate on which said electronic component is mounted; and
(c) an electronic component bonding material that bonds said electronic component and said substrate, wherein:
said electronic component of (a) is the electronic component according claim 5,
said electronic component bonding material of (c) is a bonding material having a melting temperature lower than that of said bismuth alloy contained in said electronic element bonding material included in the electronic component (a).

8. An electronic device comprising as a control means a circuit board including the bonded structure according to claim 7.

9. A bonding material comprising a bismuth alloy, wherein the bismuth alloy consists of Cu, Ge, Ni, Bi and an unavoidable impurity with a Cu content of 0.2 to 0.8 wt %, a Ge content of 0.02 to 0.2 wt %, a Ni content of 0.02 to 0.08 wt % and the remainder being Bi and the unavoidable impurity.

10. The bonding material in accordance with claim 9, further comprising at least one filler selected from the group consisting of spherical fillers, needle-shaped fillers and plate-shaped fillers, wherein a filler content is 0.05 to 5.0 wt %.

11. The bonding material in accordance with claim 10, wherein said filler comprises at least one material selected from the group consisting of resin materials, inorganic materials and metallic materials.

12. The bonding material in accordance with claim 10, wherein plating is performed on the surface of said filler, and said plating comprises at least one metal selected from the group consisting of Ag, Pd, Au and Sn.

13. An electronic component comprising:
an electronic element;
an electrode connected to said electronic element; and
an electronic element bonding material that bonds said electronic element and said electrode, wherein
said electronic element bonding material is the bonding material according to claim 9.

14. The electronic component in accordance with claim 13, wherein:
Sn is incorporated into said electronic element bonding material as an unavoidable impurity or incorporated into said electronic element bonding material from an Sn-containing plating formed on a surface of said electronic element, from an Sn-containing plating formed on a surface of said electrode, from said electronic element which contains Sn, or from said electrode which contains Sn, and
an amount of Sn incorporated into said electronic element bonding material is more than 0 wt % and 40 wt % or less of the total amount of the electronic element bonding material and Sn.

15. A bonded structure comprising:
(a) an electronic component;
(b) a substrate on which said electronic component is mounted; and
(c) an electronic component bonding material that bonds said electronic component and said substrate, wherein:
said electronic component of (a) is the electronic component according claim 13,
said electronic component bonding material of (c) is a bonding material having a melting temperature lower than that of said bismuth alloy contained in said electronic element bonding material included in the electronic component (a).

16. An electronic device comprising as a control means a circuit board including the bonded structure according to claim 15.

* * * * *